(12) United States Patent
Campanella-Pineda et al.

(10) Patent No.: US 11,549,913 B2
(45) Date of Patent: Jan. 10, 2023

(54) SHEAR-MODE CHEMICAL/PHYSICAL SENSOR FOR LIQUID ENVIRONMENT SENSING AND METHOD FOR PRODUCING THE SAME

(71) Applicant: VANGUARD INTERNATIONAL SEMICONDUCTOR SINGAPORE PTE. LTD., Singapore (SG)

(72) Inventors: Humberto Campanella-Pineda, Singapore (SG); You Qian, Singapore (SG); Vibhor Jain, Essex Junction, VT (US); Anthony Stamper, Burlington, VT (US); Rakesh Kumar, Singapore (SG)

(73) Assignee: VANGUARD INTERNATIONAL SEMICONDUCTOR SINGAPORE PTE. LTD., Singapore (SG)

(*) Notice: Subject to any disclaimer, the term of this patent is extended or adjusted under 35 U.S.C. 154(b) by 1281 days.

(21) Appl. No.: 15/976,585

(22) Filed: May 10, 2018

(65) Prior Publication Data
US 2019/0346407 A1 Nov. 14, 2019

(51) Int. Cl.
*G01N 29/02* (2006.01)
*H03H 9/02* (2006.01)
*G01N 9/00* (2006.01)

(52) U.S. Cl.
CPC .......... *G01N 29/022* (2013.01); *G01N 9/002* (2013.01); *H03H 9/02653* (2013.01); *G01N 2291/0422* (2013.01)

(58) Field of Classification Search
CPC .. G01N 29/022; G01N 29/002; G01N 29/036; G01N 2291/0422; G01N 2291/0255; G01N 2291/0256; G01N 15/0606; H03H 9/02653
See application file for complete search history.

(56) References Cited

U.S. PATENT DOCUMENTS

| | | |
|---|---|---|
| 5,212,988 A | 5/1993 | White et al. |
| 5,216,312 A | 6/1993 | Baer et al. |
| 6,543,274 B1 | 4/2003 | Herrmann et al. |
| 7,968,913 B2 | 6/2011 | Hopper et al. |
| 8,487,316 B2 * | 7/2013 | Cheng ................ H01L 21/8252 257/70 |

(Continued)

OTHER PUBLICATIONS

Zhang et al., "A Novel Bulk Acoustic Wave Resonator for Filters and Sensors Applications", Micromachines, vol. 6, No. 9, Sep. 8, 2015, retrieved on Sep. 27, 2017 from http://www.mdpi.com/2072-666X/6/9/1306, pp. 1306-1316.

(Continued)

*Primary Examiner* — Tarun Sinha
(74) *Attorney, Agent, or Firm* — Winston Hsu

(57) ABSTRACT

Methods of forming a shear-mode chemical/physical sensor for liquid environment sensing on V-shaped grooves of a [100] crystal orientation Si layer and the resulting devices are provided. Embodiments include forming a set of V-shaped grooves in a [100] Si layer over a substrate; forming an acoustic resonator over and along the V-shaped grooves, the acoustic resonator including a first metal layer, a thin-film piezoelectric layer, and a second metal layer in an IDT pattern or a sheet; and forming at least one functional layer along a slope of the acoustic resonator.

20 Claims, 32 Drawing Sheets

(56) References Cited

U.S. PATENT DOCUMENTS

| | | | |
|---|---|---|---|
| 9,059,075 B2 | 6/2015 | Bayram et al. | |
| 9,997,872 B2* | 6/2018 | Wu | H01R 13/6616 |
| 2015/0079738 A1 | 3/2015 | Barlow | |
| 2017/0117871 A1* | 4/2017 | Rivas | G01N 29/036 |

OTHER PUBLICATIONS

Zheng et al., "ALN-Based Film Buck Acoustic Resonator Operated in Shear Mode for Detection of Carcinoembryonic Antigens", Royal Society of Chemistry Advances, vol. 6, Jan. 6, 2016, pp. 4908-4913.

Chen et al., "Frequency-Multiplexed Combinatory Mass Sensing with Single Data Line from Multiple Integrated Film Bulk Acoustic Resonators", 16th International Conference on Solid-State Sensors, Actuators and Microsystems (Transducers), IEEE, Jun. 5-9, 2011, retrieved on Sep. 27, 2017 from https://docslide.com.br/download/link/ieee-transducers-2011-2011-16th-international-solid-state-sensors-actuators-58dfa9e1429ba,pp. 783-786.

Rughoobur et al., "Gravimetric Sensors Operating at 1.1 GHZ Based on Inclined C-axis ZnO grown on Textured AL Electrodes", Scientific Reports, vol. 7, May 2, 2017, retrieved on Sep. 27, 2017 from https://www.nature.com/articles/s41598-017-01545-2.pdf, 9 Pages.

Zhang et al., "Micromachined Acoustic Resonant Mass Sensor", Journal of Microelectromechanical Systems, IEEE, vol. 14, No. 4, Aug. 8, 2005, pp. 699-706.

Lin et al., "Real-Time Label-Free Detection of DNA Synthesis by FBAR-Based Mass Sensing", Proceedings of International Ultrasonics Symposium, IEEE, 2010, pp. 1286-1289.

Zhang et al., "Sequence Specific Label-Free DNA Sensing Using Film-Buck-Acoustic-Resonators", Sensors Journal, IEEE, vol. 7, No. 12, Dec. 2007, retrieved on Sep. 27, 2017 from https://www.bioee.ee.columbia.edu/courses/upload/Bibliography/FBAR_DNA_J_Sensors.pdf, pp. 1587-1588.

Wingqvist et al., "Shear Mode ALN Thin Film Electro-Acoustic Resonant Sensor Operation in Viscous Media", Sensors and Actuators B, vol. 123, No. 1, Apr. 10, 2007, retrieved on Sep. 27, 2017 from https://www2.warwick.ac.uk/fac/sci/eng/research/grouplist/sensorsanddevices/mbl/database/fbar_references/shear_mode_aln_thin_film_electro-acoustic_resonant_sensor_operation_in_viscous_media.pdf, pp. 466-473.

Tran et al., "Shear Mode Resonators Based on Aluminum Nitride Round Membranes with a Ring-Shaped Electrode", 17th International Conference on Solid-State Sensors, Actuators and Microsystems (Transducers & Eurosensors XXVII), IEEE, Jun. 16-20, 2013, retrieved on Sep. 27, 2017 from https://www.researchgate.net/profile/An_Tran10/publication/261064830_Shear_mode_resonators_based_on_Aluminum_Nitride_round_membranes_with_ring-shaped_electrode.

Anderas et al., "Tilted C-Axis Thin-Film Bulk Wave Resonant Pressure Sensors with Improved Sensitivity", Sensors Journal, IEEE, vol. 12, No. 8, 2012, retrieved on Sep. 27, 2017 from http://uu.diva-portal.org/smash/get/diva2:516832/FULLTEXT04.pdf, pp. 2653-2654.

* cited by examiner

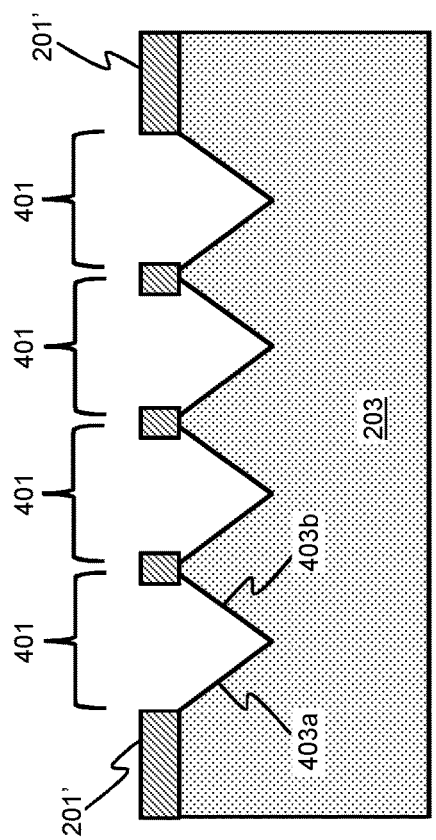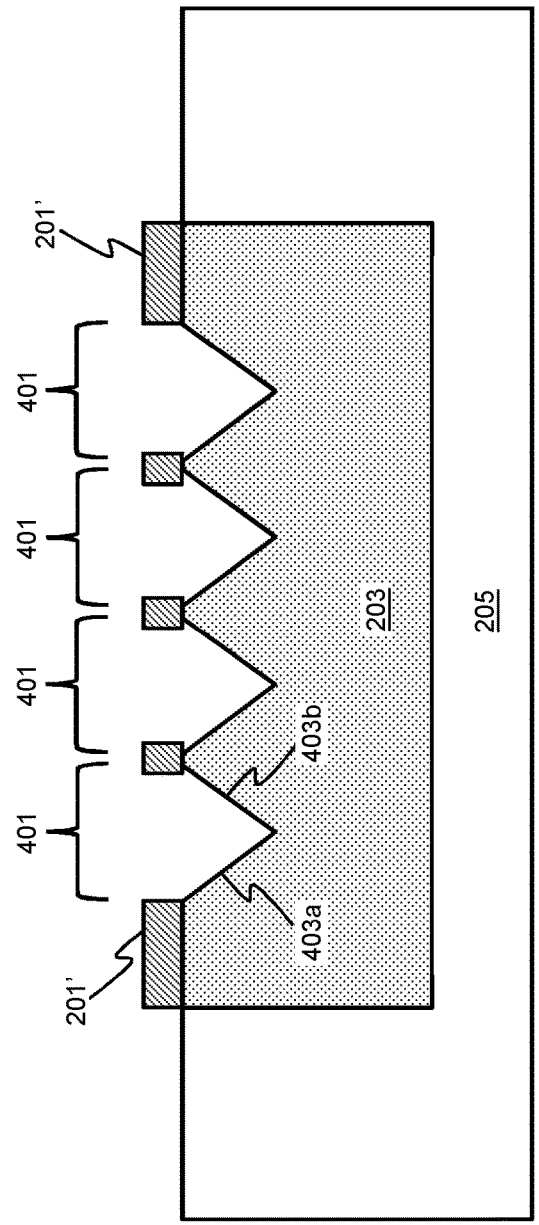

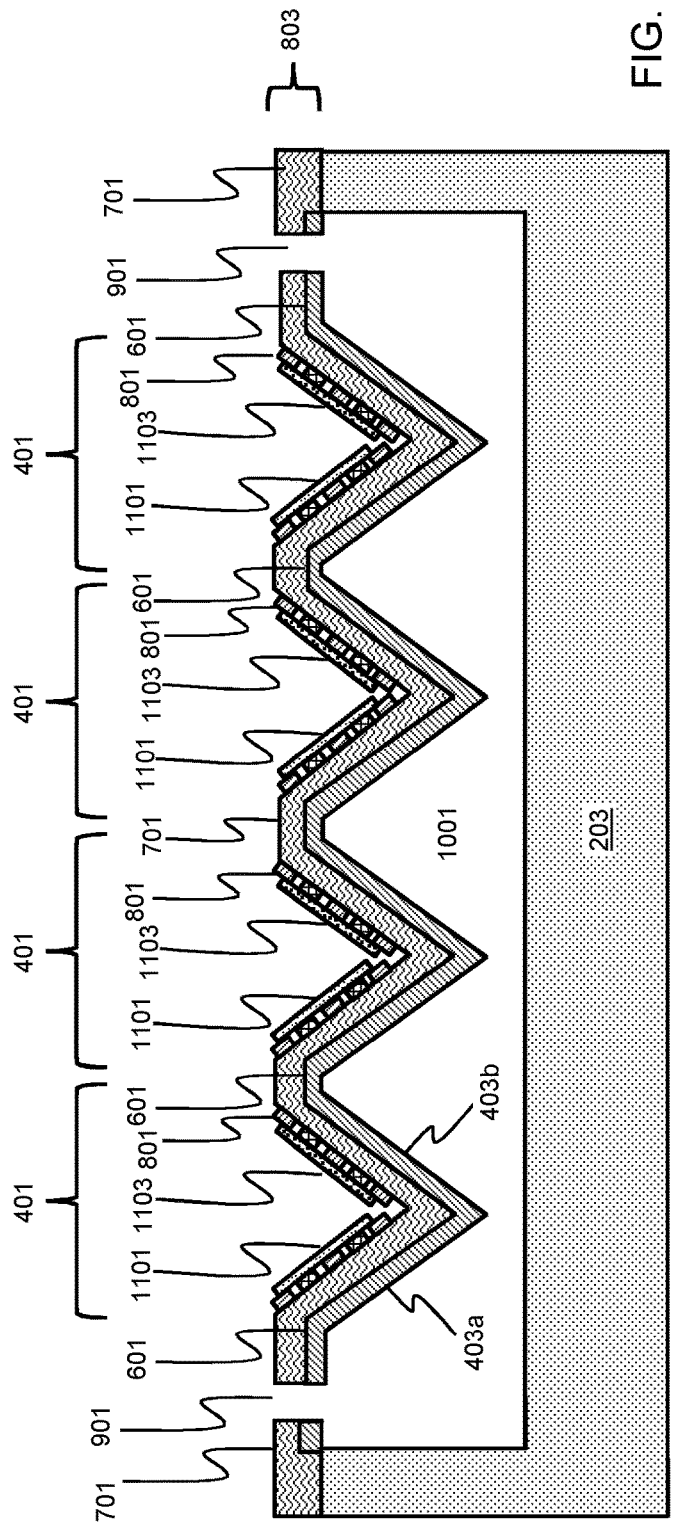

SHEAR-MODE CHEMICAL/PHYSICAL SENSOR FOR LIQUID ENVIRONMENT SENSING AND METHOD FOR PRODUCING THE SAME

CROSS-REFERENCE TO RELATED APPLICATION

This application is related to U.S. Nonprovisional Application, titled "ACOUSTIC WAVE FILTER FORMED ON A V-GROOVE TOPOGRAPHY AND METHOD FOR PRODUCING THE SAME," being filed concurrently.

TECHNICAL FIELD

The present disclosure relates to microelectromechanical systems (MEMS) design for semiconductor devices. The present disclosure is particularly applicable to shear-mode sensors.

BACKGROUND

Mainstream microbalances for physical and chemical sensing in liquid environments use surface acoustic wave (SAW) and bulk acoustic wave (BAW) resonators. However, SAW and BAW resonators suffer from dramatic viscous damping in liquid. Such damping reduces the quality (Q) factor and the sensitivity of the detector. A known solution to improve the loaded Q is a shear-mode sensor. A cross-sectional view of a portion of a process flow for forming a known shear-mode sensor is depicted in FIG. 1. Referring to FIG. 1, a silicon (Si) substrate 101 is placed on an inclined plasma vapor deposition (PVD) tool stage 103. Thereafter, tilted aluminum nitride (AlN) crystals 105 are formed on the Si substrate 101 by PVD, as illustrated by the target atoms 107 sputtered down from the sputtering target (not shown for illustrative convenience). Known shear-mode sensors can improve the loaded Q; however, the tilted-substrate deposition solution, as depicted in FIG. 1, hinders mass production and repeatability.

A need therefore exists for methodology enabling formation of a commercially feasible chemical/physical shear-mode sensor for liquid environment sensing with a high Q factor and sensitivity and the resulting device.

SUMMARY

An aspect of the present disclosure is a method of forming a shear-mode chemical/physical sensor for liquid environment sensing on V-shaped grooves of a [100] crystal orientation Si layer over a substrate.

Another aspect of the present disclosure is a device including a shear-mode chemical/physical sensor for liquid environment sensing formed on V-shaped grooves of a [100] crystal orientation Si layer over a substrate.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: forming a set of V-shaped grooves in a [100] crystal orientation Si layer over a substrate; forming an acoustic resonator over and along the V-shaped grooves, the acoustic resonator including a first metal layer, a thin-film piezoelectric layer, and a second metal layer in an interdigitated (IDT) pattern or a sheet; and forming a functional layer along at least one slope of the acoustic resonator.

Another aspect of the present disclosure is a device including: a set of V-shaped grooves in a [100] crystal orientation Si layer over a substrate; an acoustic resonator over and along the V-shaped grooves, the acoustic resonator including a first metal layer, a thin-film piezoelectric layer, and a second metal layer in an IDT pattern or a sheet along; and a functional layer along at least one slope of the acoustic resonator, wherein the device is a sensor with customizable sensitivity.

A further aspect of the present disclosure is a method including: forming a set of V-shaped grooves in a [100] crystal orientation Si layer over a substrate by wet etch or dry etch; forming a Bragg reflector along the V-shaped grooves; forming an acoustic resonator over and along opposing slopes of the Bragg reflector, the acoustic resonator including a first metal layer, a thin-film piezoelectric layer, and a second metal layer in an IDT pattern or a sheet; forming a cavity in the [100] crystal orientation Si layer under the Bragg reflector; and forming a functional layer along at least one slope of the acoustic resonator.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which:

FIGS. 2A and 2B through 6A and 6B, respectfully, and FIGS. 7 through 11 schematically illustrate cross-sectional views of a process flow for forming a shear-mode chemical/physical sensor for liquid environment sensing on V-shaped grooves of a [100] crystal orientation Si layer over a substrate, in accordance with an exemplary embodiment;

FIG. 12 schematically illustrates a top view of FIG. 11 showing the cut lines for FIG. 11;

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problems of low Q factor and sensitivity as a result of dramatic viscous damping in liquid and commercial feasibility issues attendant upon using SAW and BAW acoustic resonators and known shear-mode sensors for physical and chemical sensing in liquid environments, respectively. The problems are solved, inter alia, by forming a shear-mode chemical/physical sensor for liquid environment sensing on V-shaped grooves of a [100] crystal orientation Si layer over a substrate.

Methodology in accordance with embodiments of the present disclosure includes forming a set of V-shaped grooves in a [100] crystal orientation Si layer over a substrate. An acoustic resonator is formed over and along the V-shaped grooves, the acoustic resonator including a first metal layer, a thin-film piezoelectric layer, and a second metal layer in an IDT pattern or a sheet and a functional layer is formed along at least one slope of the acoustic resonator.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 2A:
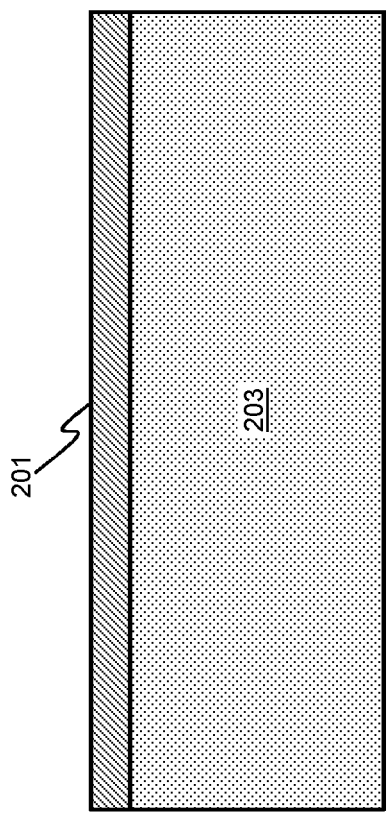
Figure 2B:
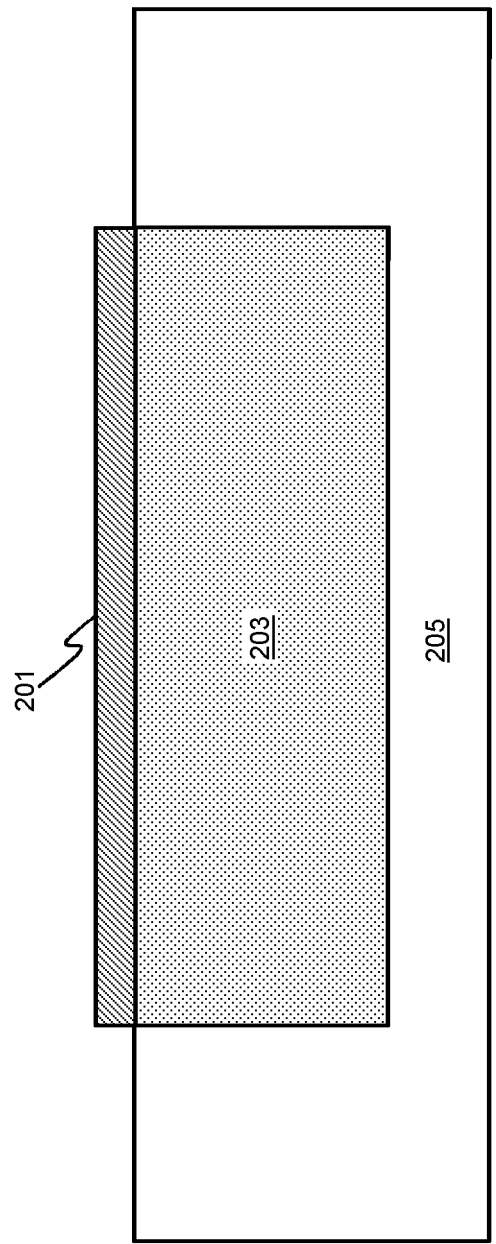

FIGS. 2A and 2B through 6A and 6B, respectfully, and FIGS. 7 through 11 schematically illustrate cross-sectional views of a process flow for forming a shear-mode chemical/physical sensor for liquid environment sensing on V-shaped grooves of a [100] crystal orientation Si layer over a substrate and FIG. 12 schematically illustrates a top view of FIG. 11 showing the cut lines for FIG. 11, in accordance with an exemplary embodiment. Referring to FIGS. 2A and 2B, a photoresist (PR) or hard mask (HM) 201 is formed over a [100] crystal orientation Si layer 203 formed over a substrate (not shown for illustrative convenience). In one instance, the [100] crystal orientation Si layer 203 may be formed as a sacrificial layer in a substrate 205, as depicted in FIG. 2B. The substrate 205 may be formed of sapphire, silica glass, [111] crystal orientation Si, or a similar substrate material.

Figure 3A:
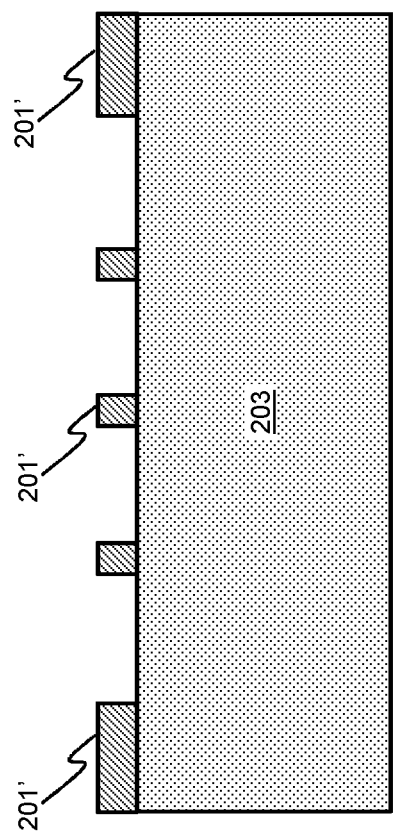
Figure 3B:
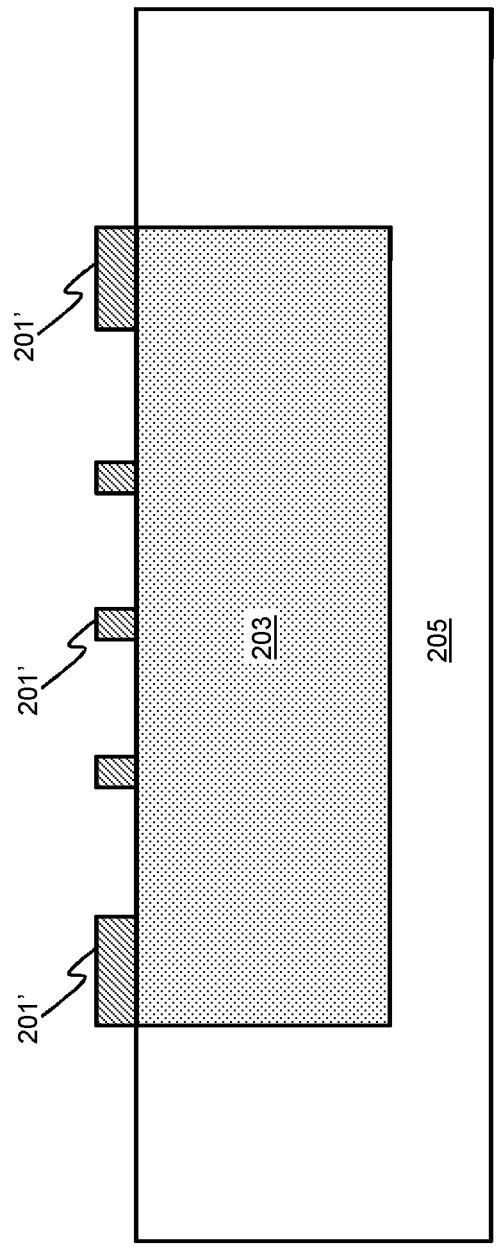
Figure 5A:
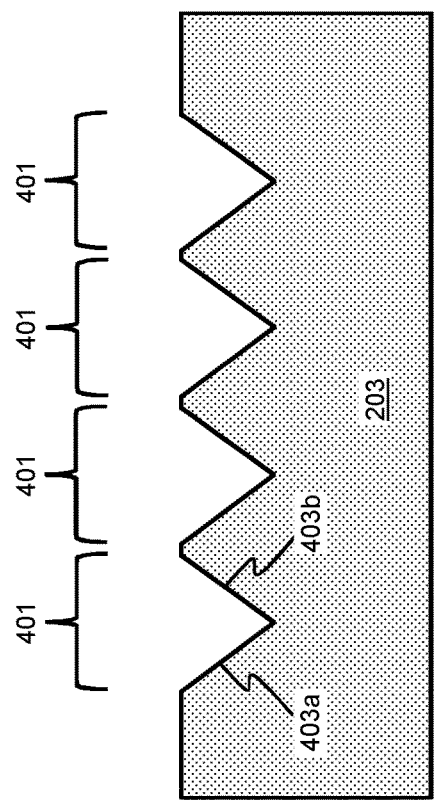
Figure 5B:
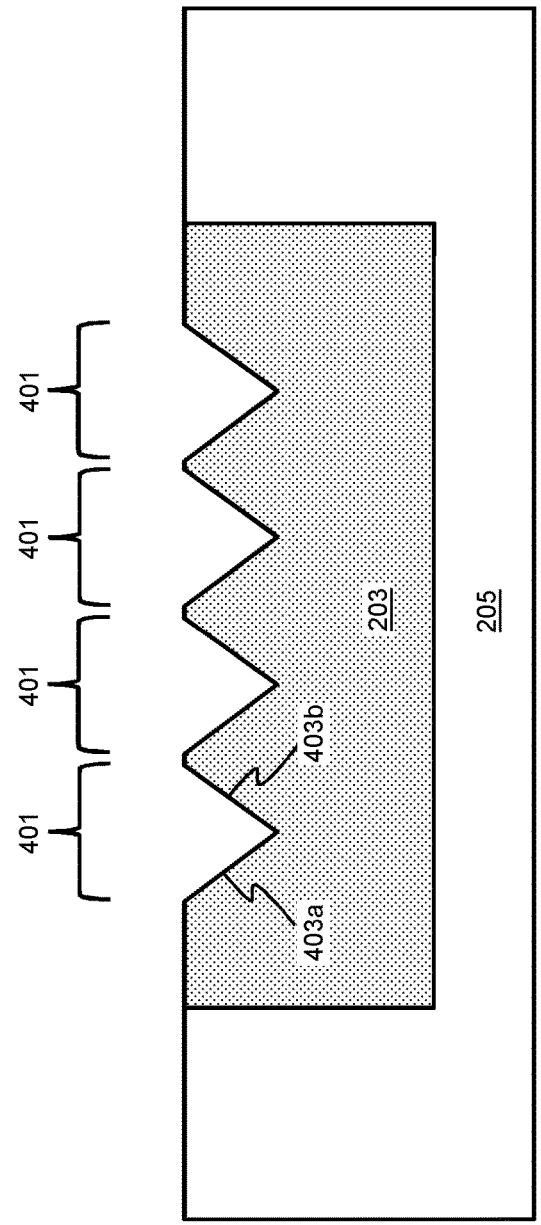

Referring to FIGS. 3A and 3B, the PR or HM 201 is patterned, e.g., by photolithography, depending on a desired width and depth of each subsequently formed V-shape groove, forming the PR or HM 201'. A set of V-shaped grooves 401 are then formed through the PR or HM 201' in a portion of the [100] crystal orientation Si layer 203 by a wet etch or a dry etch, as depicted in FIGS. 4A and 4B. In one instance, the V-shaped grooves 401 are formed by anisotropic wet etching using potassium hydroxide (KOH) or tetramethylammonium hydroxide (TMAH) until the surfaces 403a and 403b of each V-shaped groove 401 find each other. In this instance, the depth of each V-shaped groove 401 may be 5 micrometer ($\mu m$) by 5 $\mu m$ in width and the surfaces 403a and 403b each have a slope of 54.7°. In one instance, an anisotropic dry etch process may be used to create the V-shaped grooves 401 with a variety of angles, e.g., the surfaces 403a and 403b each having a slope between 10° and 70°. Thereafter, the PR or HM 201' is stripped or removed, as depicted in FIGS. 5A and 5B. It should be understood that the number of V-shaped grooves 401 in FIGS. 2A and 2B through 6A and 6B, respectively, and 7 through 11 are meant to represent a section of a device; however, the specific number of V-shaped grooves 401 is for illustration convenience only and not intended as a limitation, e.g., the set or device may include 10 V-shaped grooves 401 or the set or device may include a 10×10 array of V-shaped grooves 401, etc.

Figure 6A:
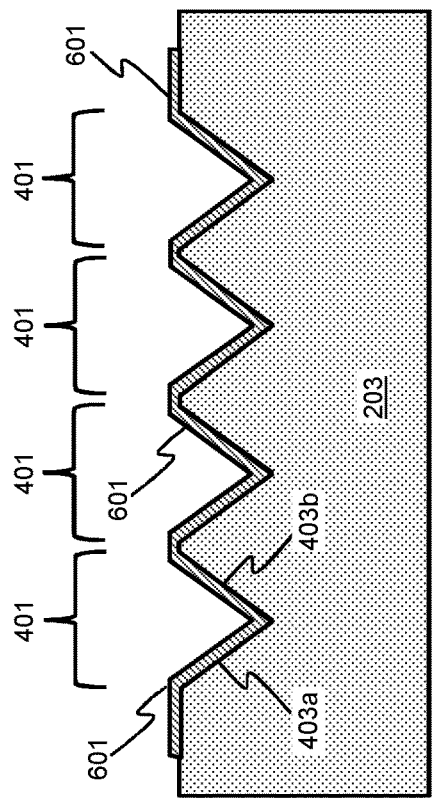
Figure 6B:
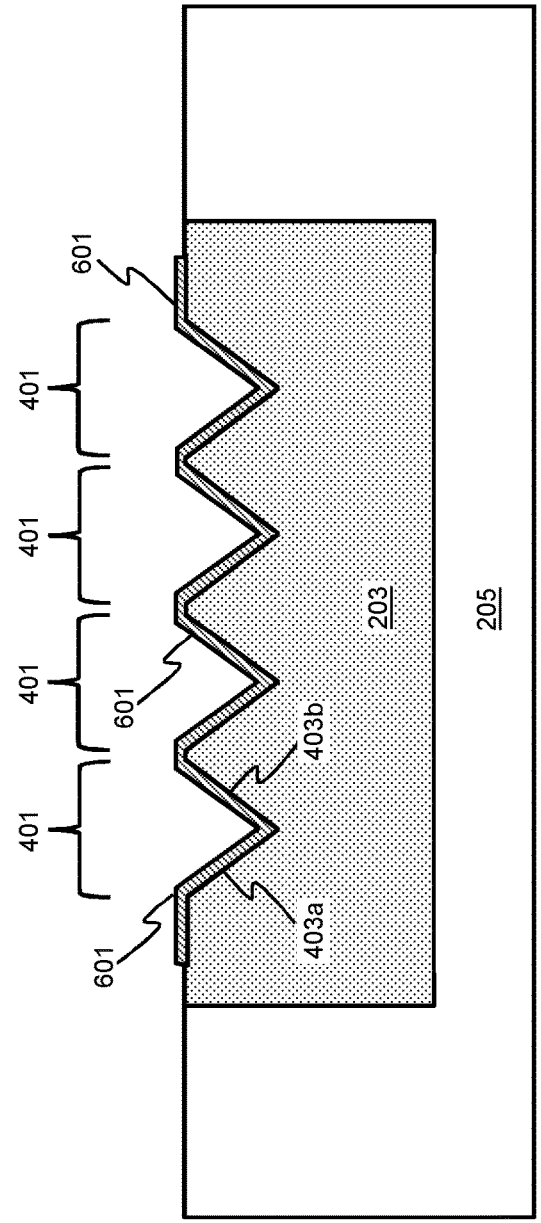

Subsequently, a dielectric isolation layer (not shown for illustrative convenience) is formed over the [100] crystal orientation Si layer 203. A seed layer (not shown for illustrative convenience) is also formed, e.g., AlN, over and along the opposing surfaces/slopes of the dielectric isolation layer within the V-shaped grooves 401. In one instance, the seed layer may also be formed on respective portions of the [100] crystal orientation Si layer 203 adjacent to the V-shaped grooves 101. Thereafter, a metal layer 601 (the bottom electrode of a subsequently formed shear-mode acoustic wave resonator) is formed, e.g., of molybdenum (Mo) or tungsten (W), over the [100] crystal orientation Si layer 203 and patterned, as depicted in FIGS. 6A and 6B. For the purpose of illustrative convenience, the subsequent steps described with respect to FIGS. 7 through 11 are described following FIG. 6A; however, it should be understood that the same steps may follow from FIG. 6B.

Figure 1:
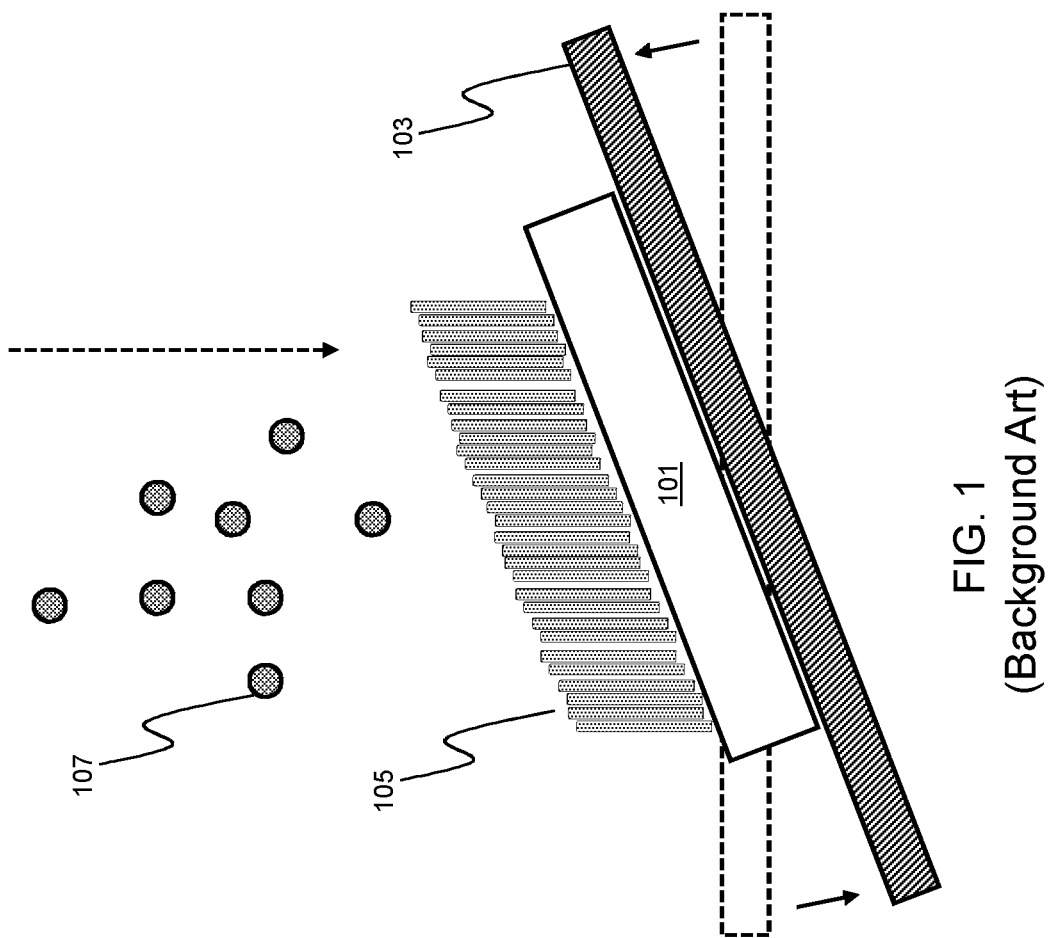
FIG. 1 schematically illustrates a cross-sectional view of a portion of a process flow for forming a background shear-mode sensor.
Figure 7:
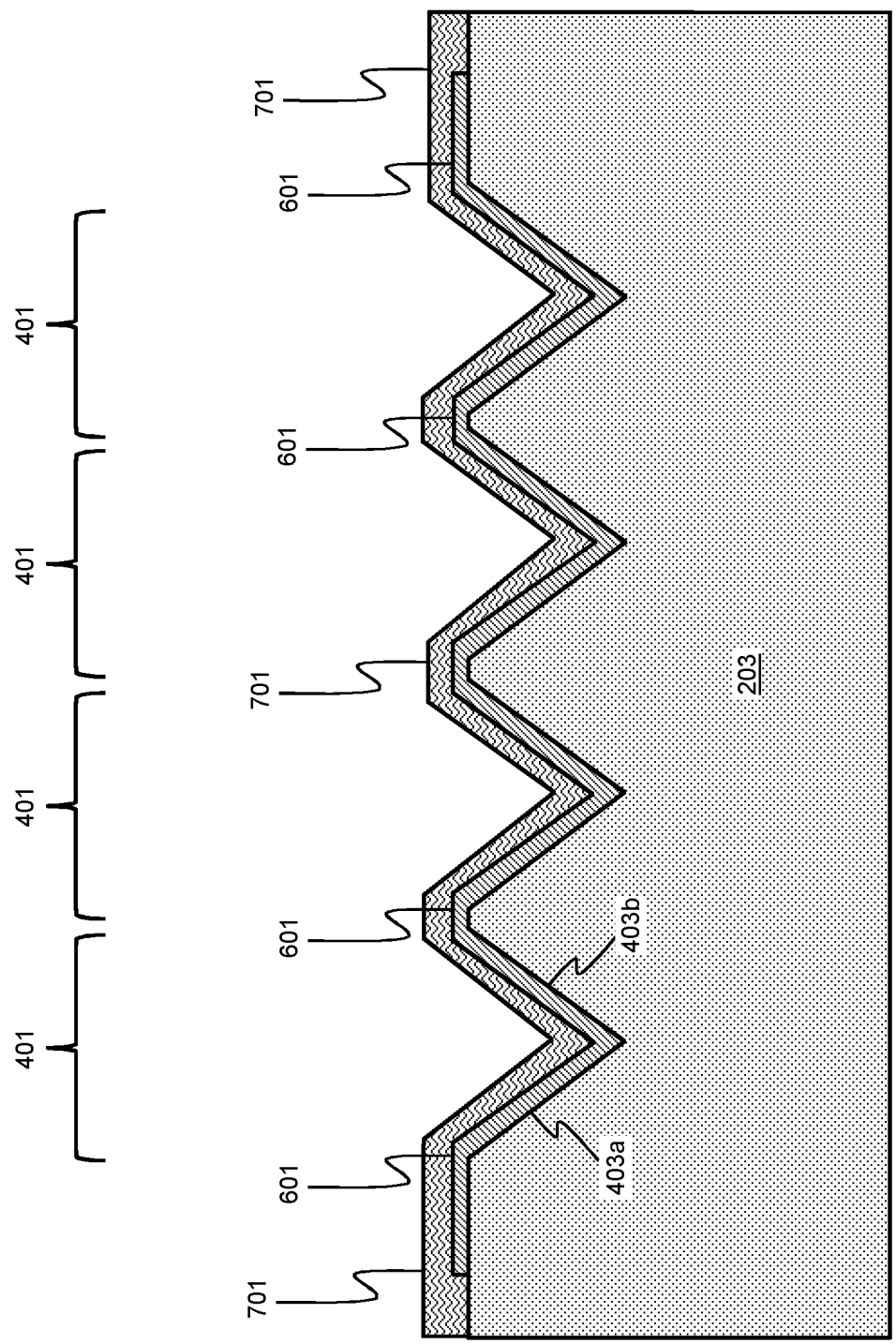

Referring to FIG. 7, a thin-film piezoelectric layer 701 is formed, for example, of AlN, scandium aluminum nitride (SLAIN), zinc oxide (ZnO), lithium niobate (LiNbO$_3$), lithium tantalite (LiTaO$_3$), lead zirconate titanate (PZT), polyvinylidene fluoride (PVDF), or a material having similar functional properties, e.g., AlN, over the metal layer 601 and the respective portions of the [100] crystal orientation Si layer 203 by PVD. Specifically, the PVD deposition of the thin-film piezoelectric layer 701 on the V-shaped grooves 401 creates tilted crystals similar to the tilted crystals 105 of FIG. 1; however, in this instance, a tilted substrate 103 is not required. In addition, there is a crystal poling component on both the X and Y axis. Further, the X-axis component promotes shear coupling ($k^2_{15}$), which drives shear-mode vibration. It should be understood that the material of the seed layer will change depending on the material of the thin-film piezoelectric layer 701.

Figure 8:
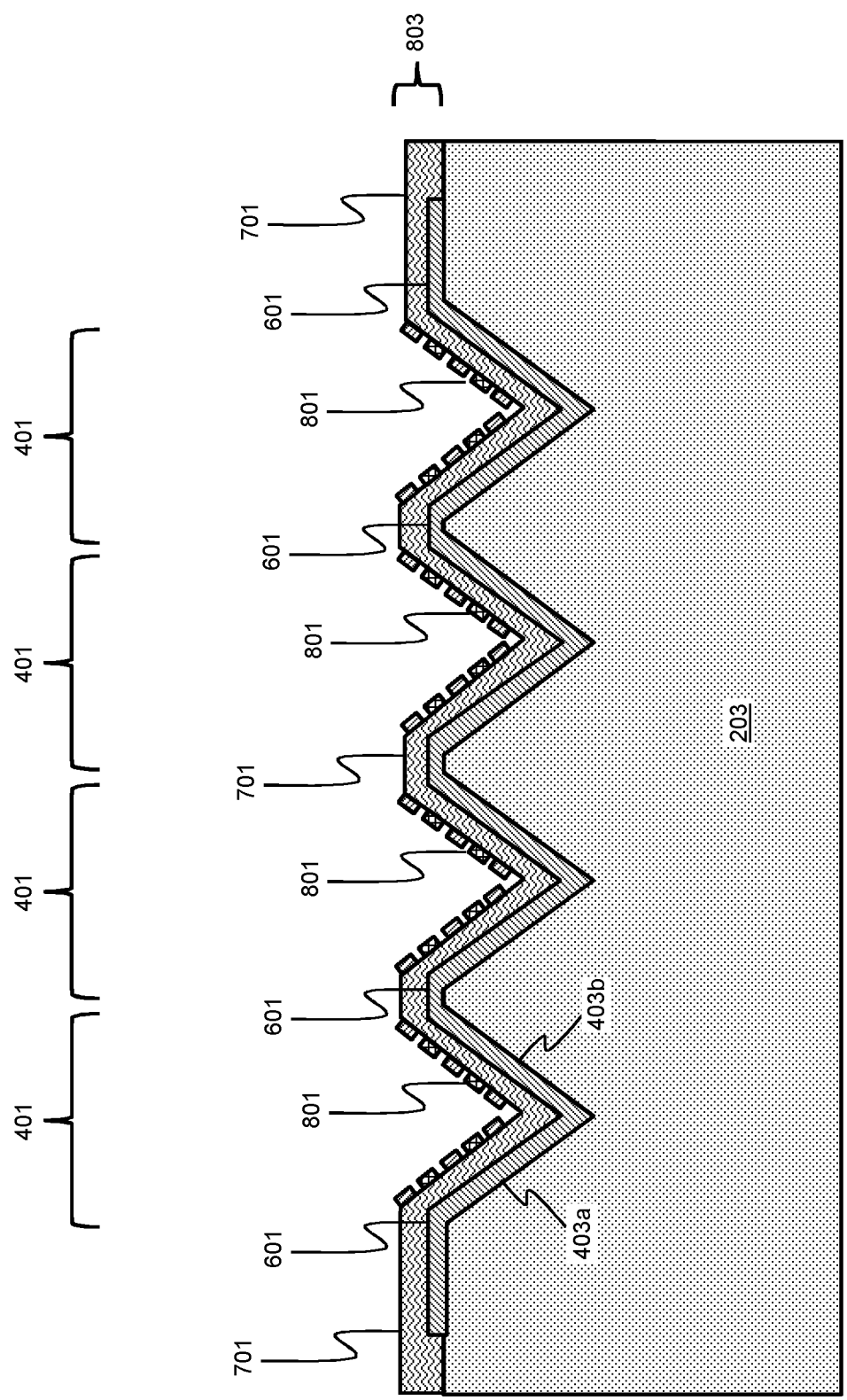

Thereafter, a metal layer 801 (the top electrode of the shear-mode acoustic wave resonator 803) is formed, e.g., of Mo or W, in an IDT pattern along opposing slopes of the thin-film piezoelectric layer 701, as depicted in FIGS. 8 and 12. The metal layer 801 may also be formed in a sheet along opposing slopes of the thin-film piezoelectric layer 701 as depicted in FIG. 14B or over and along opposing slopes of the thin-film piezoelectric layer 701, as depicted in FIG. 14D. For the purpose of illustrative convenience, FIGS. 8 through 11 are described and illustrated with respect to a metal layer 801 formed in an IDT pattern; however, it should be understood that substantially similar steps would follow if the metal layer 801 was formed in a sheet. In the instance where the metal layer 801 is formed in an IDT pattern, a spray coating (not shown for illustrative convenience) may be applied in connection with the formation of the metal layer 801 to avoid IDT pattern distortion due to a thick and non-uniform PR coat along with an antireflective coating to avoid unwanted PR patterning due to V-reflected waves and an optional oxide filling and chemical mechanical polishing (CMP) to ensure electrode patterning in the grooved area (both not shown for illustrative convenience). The individual digits or fingers of the IDT pattern 801 are formed of the same material; however, the individual digits or fingers may alternate in terms of polarity, as more clearly depicted in FIG. 12. It should also be noted that the metal layer 301, the thin-film piezoelectric layer 401, and the metal layer 501, may also be formed only within the boundaries of the V-shaped grooves 401.

Figure 9:
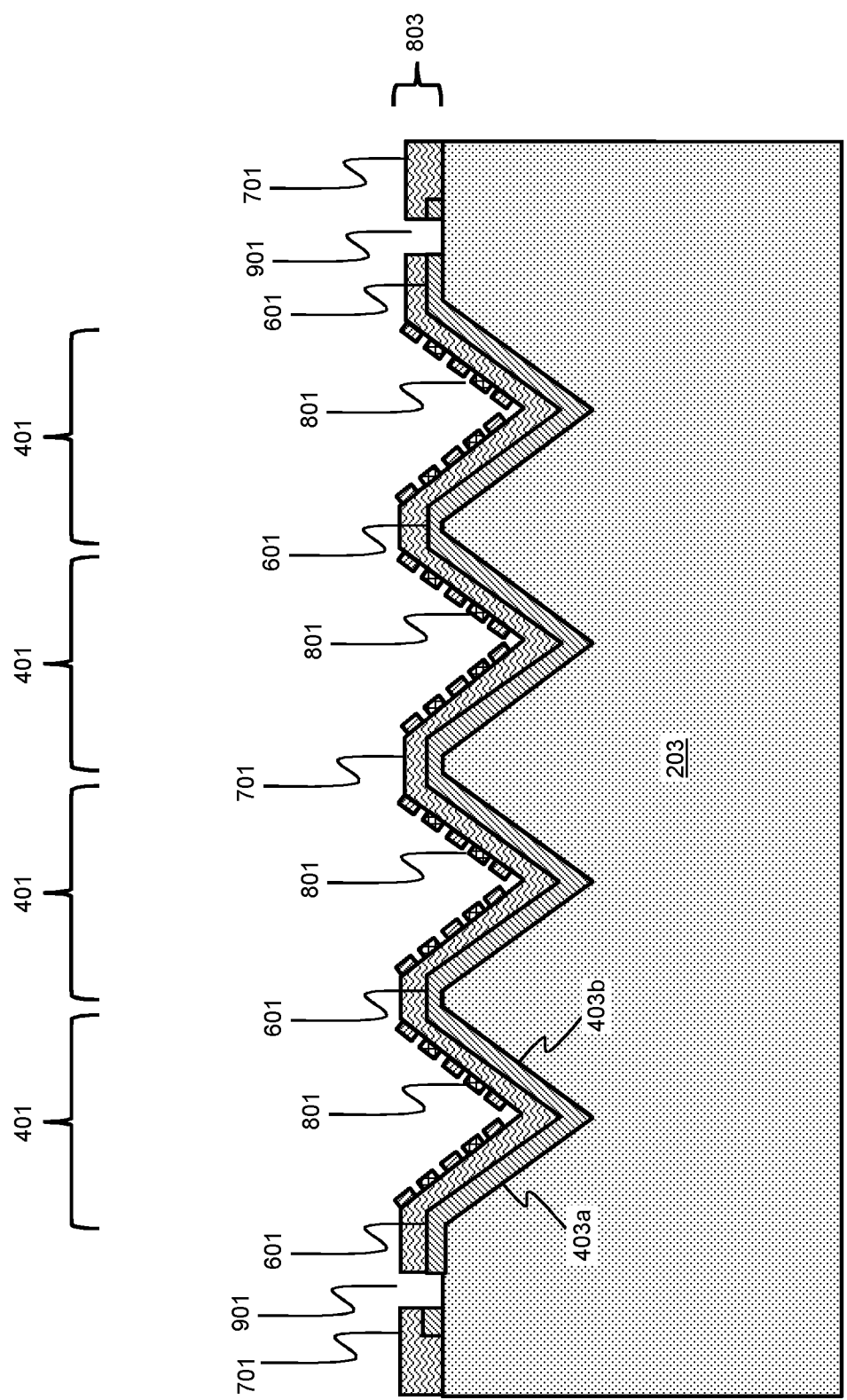
Figure 10:
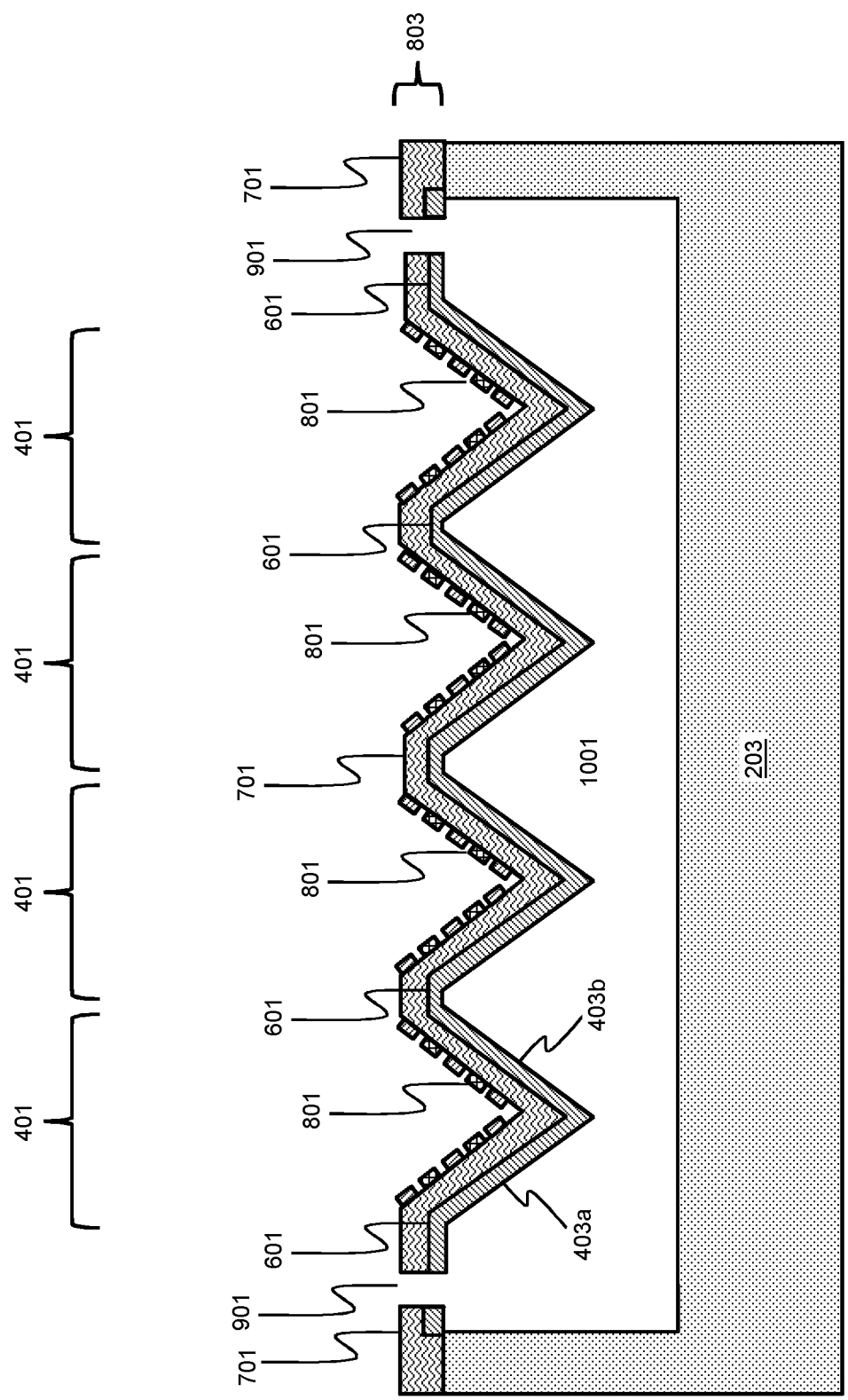

Referring to FIG. 9, vias 901 are formed through the thin-film piezoelectric layer 701 and the metal layer 601 down to the [100] crystal orientation Si layer 203. The [100] crystal orientation Si layer 203 is then patterned through the vias 901 and a release is performed to form the cavity 1001 in a portion of the [100] crystal orientation Si layer 203, as depicted in FIG. 10.

A functional layer 1101 is then formed, e.g., gold (Au) and a bio-binder along at least one surface/slope of the shear-mode acoustic wave resonator 803, e.g., along surface 403a, as depicted in FIG. 11. In one instance, the functional layer 1101 may be: (1) formed along both of the opposing surfaces or slopes of the V-shaped grooves 401, e.g., surfaces 403a and 403b, (FIG. 14C); (2) formed along one surface, e.g., 403a or 403b, and a second function layer 1103 may be formed, e.g., Au and a second bio-binder, along the opposing surface or slope (FIG. 11); (3) a plurality of functional layers, e.g., functional layers 1101, 1103, n, n+1, etc., may be formed along opposing slopes of the shear-mode acoustic wave resonator 803, e.g., functional layers 1101 and 1103 along surface 403a and functional layers 1101 and 1103 along surface 403b or functional layers 1101, 1103, and n along surface 403a and functional layers 1103, n, and n+1 along surface 403b, and so forth; or (4) one or more functional layers, e.g., functional layers 1101 and 1103, n, n+1, etc., may be formed along one or more portions of the shear-mode acoustic wave resonator 803, e.g., (a) functional layers 1101, 1103, n, and n+1 along the V-shaped grooves 401, respectively; (b) functional layer 1101 along 2 V-shaped grooves 401 and functional layer 1103 along 2 V-shaped grooves 401; (c) functional layer 1101 along 2 V-shaped grooves 401 and functional layers 1101 and 1103 along 2 V-shaped grooves 401, and so forth. Again, it should be understood that the functional layers 1101, 1103, n, n+1, etc. could similarly be formed over the shear-mode acoustic wave resonator 803 having the metal layer 801 formed in a sheet 801' (FIG. 14B or 14D).

Figure 13:
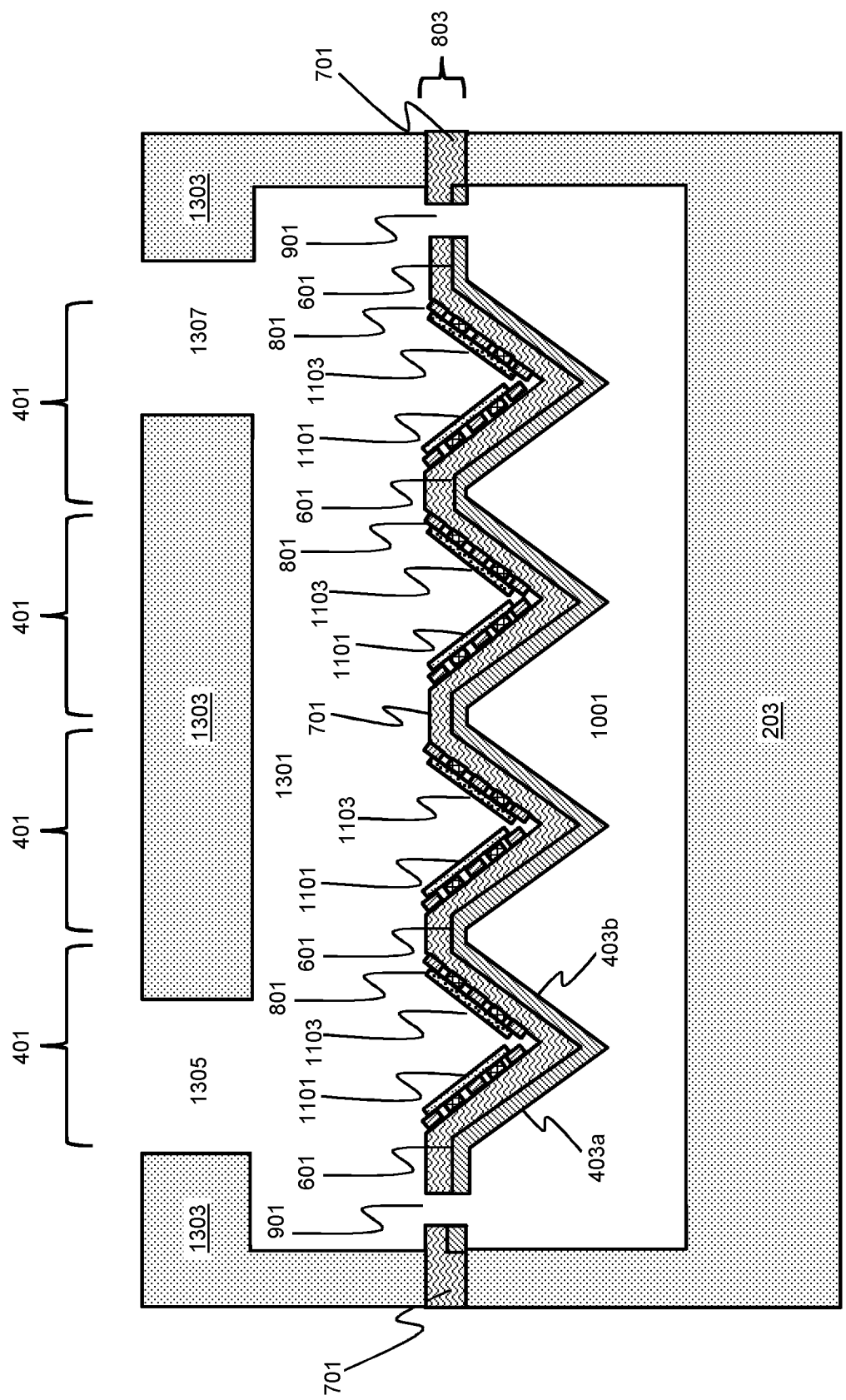
FIG. 13 schematically illustrates a cross-sectional view of FIG. 11 with an optional cap cavity, capping layer, fluid inlet, and fluid outlet, in accordance with an exemplary embodiment.

In one instance, a cap cavity 1301 is formed over the set of V-shaped grooves 401, a capping layer 1303 is formed over the cap cavity 1301, and a fluid inlet 1305 and a fluid outlet 1307 are formed through the capping layer 1303 down to the cap cavity 1301, as depicted in FIG. 13.

Figure 14A:
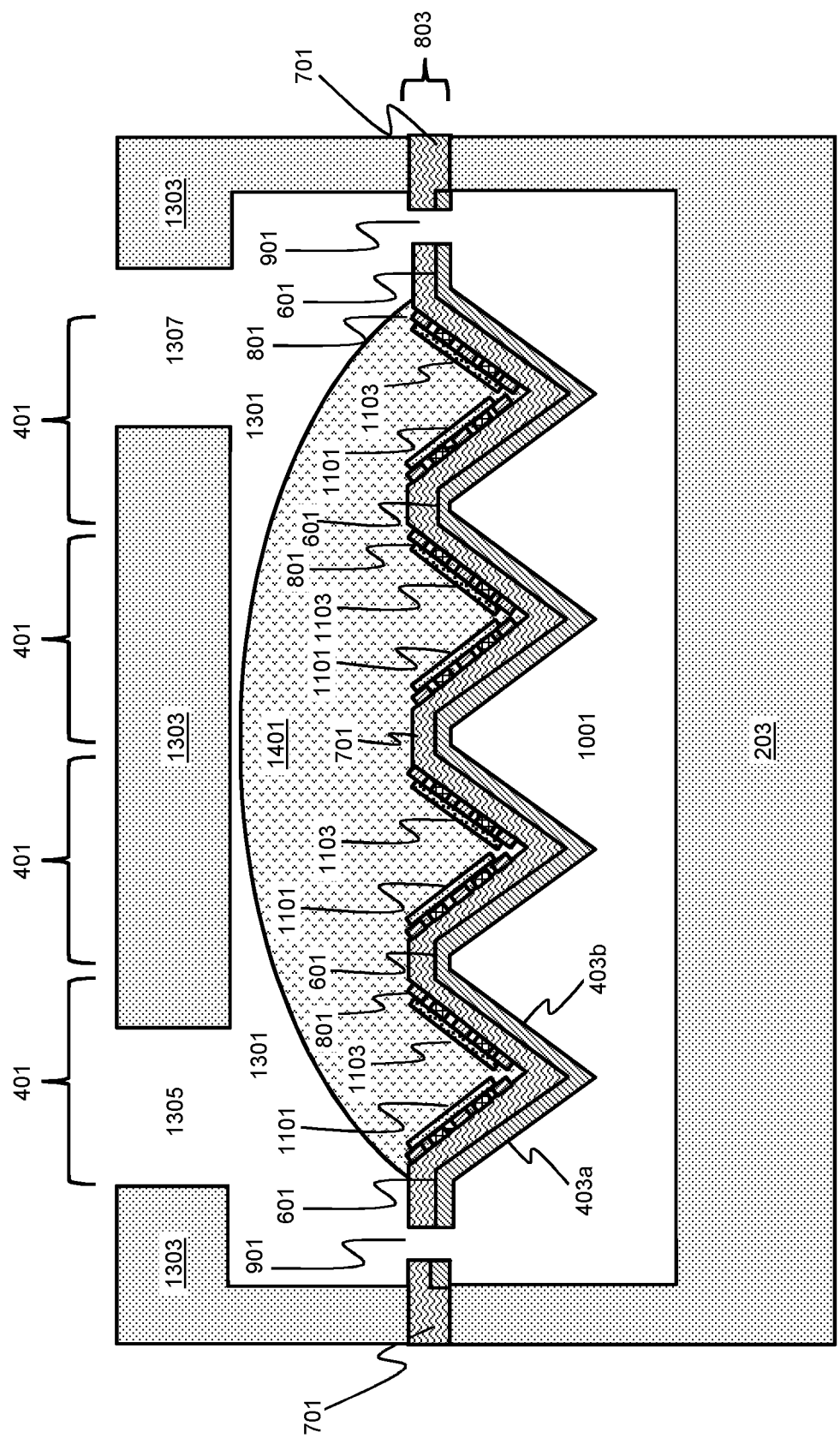
FIGS. 14A through 14D schematically illustrate cross-sectional views of FIG. 13 with: (1) an IDT top electrode and two different functional layers per V-shaped groove; (2) a sheet top electrode and two different functional layers per V-shaped groove; (3) an IDT top electrode and one functional layer over and along the V-shaped grooves; and (4) a sheet top electrode and one functional layer over and along the V-shaped grooves, respectively, in accordance with an exemplary embodiment.
Figure 14B:
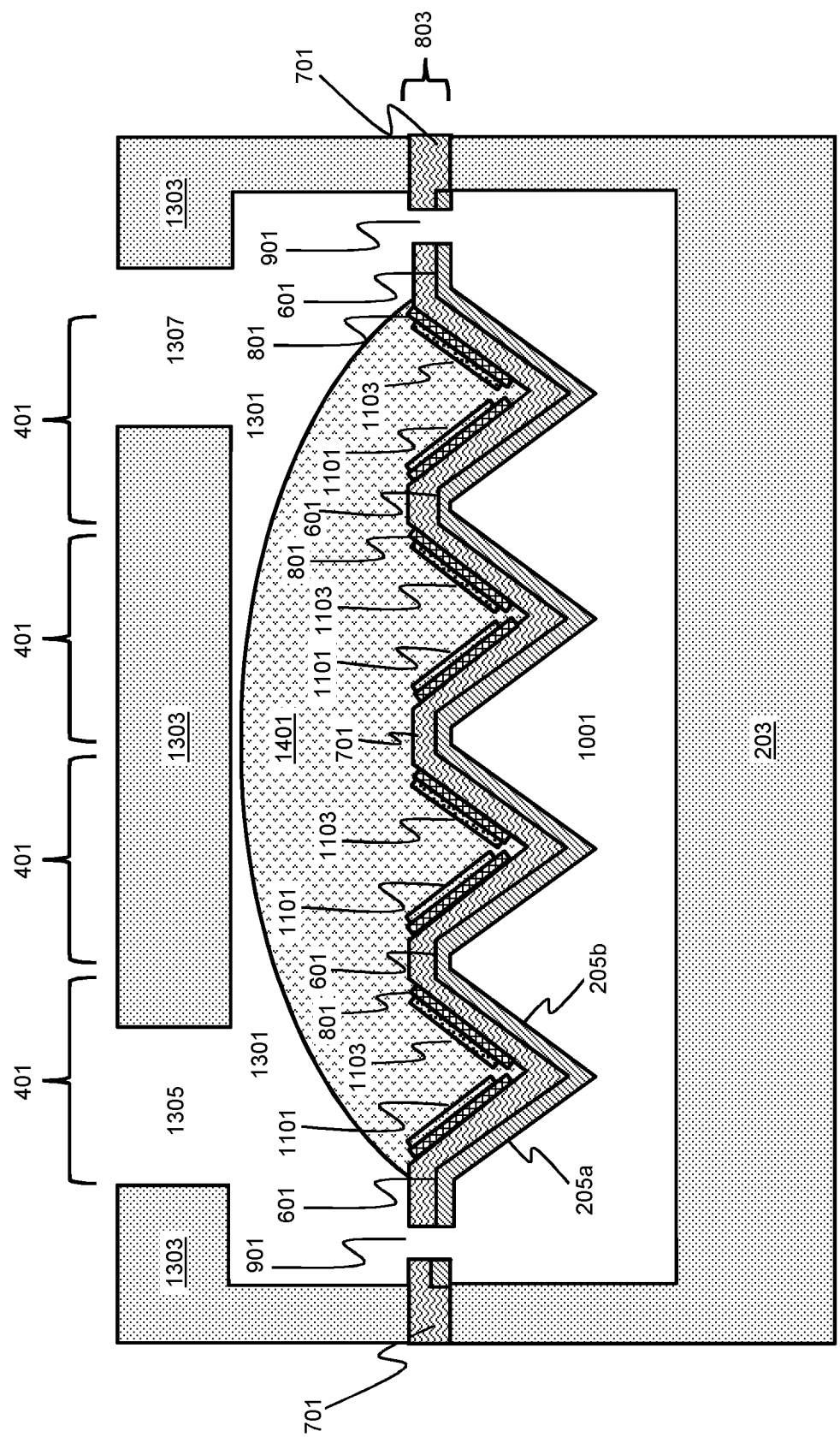
Figure 14C:
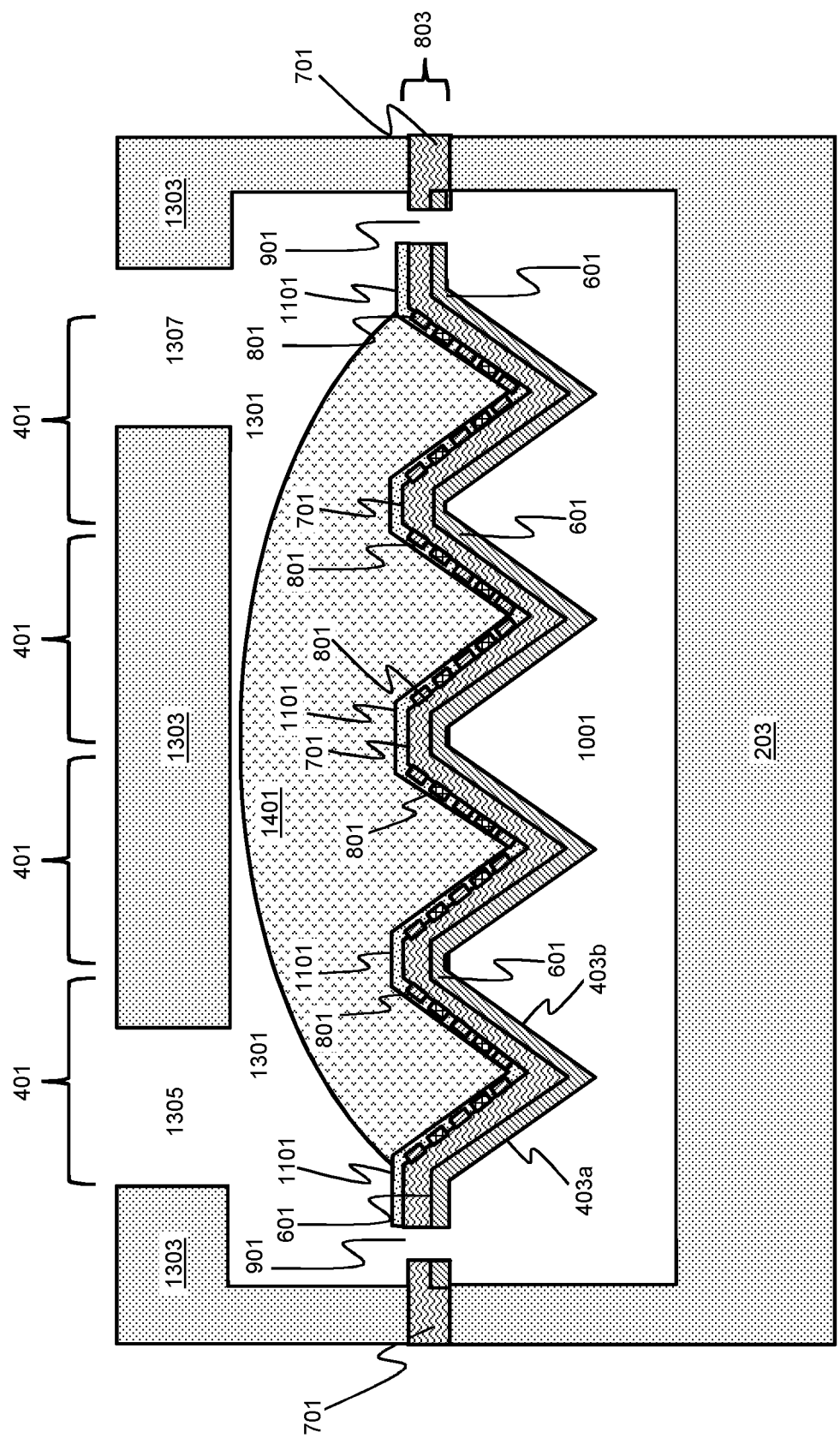
Figure 14D:
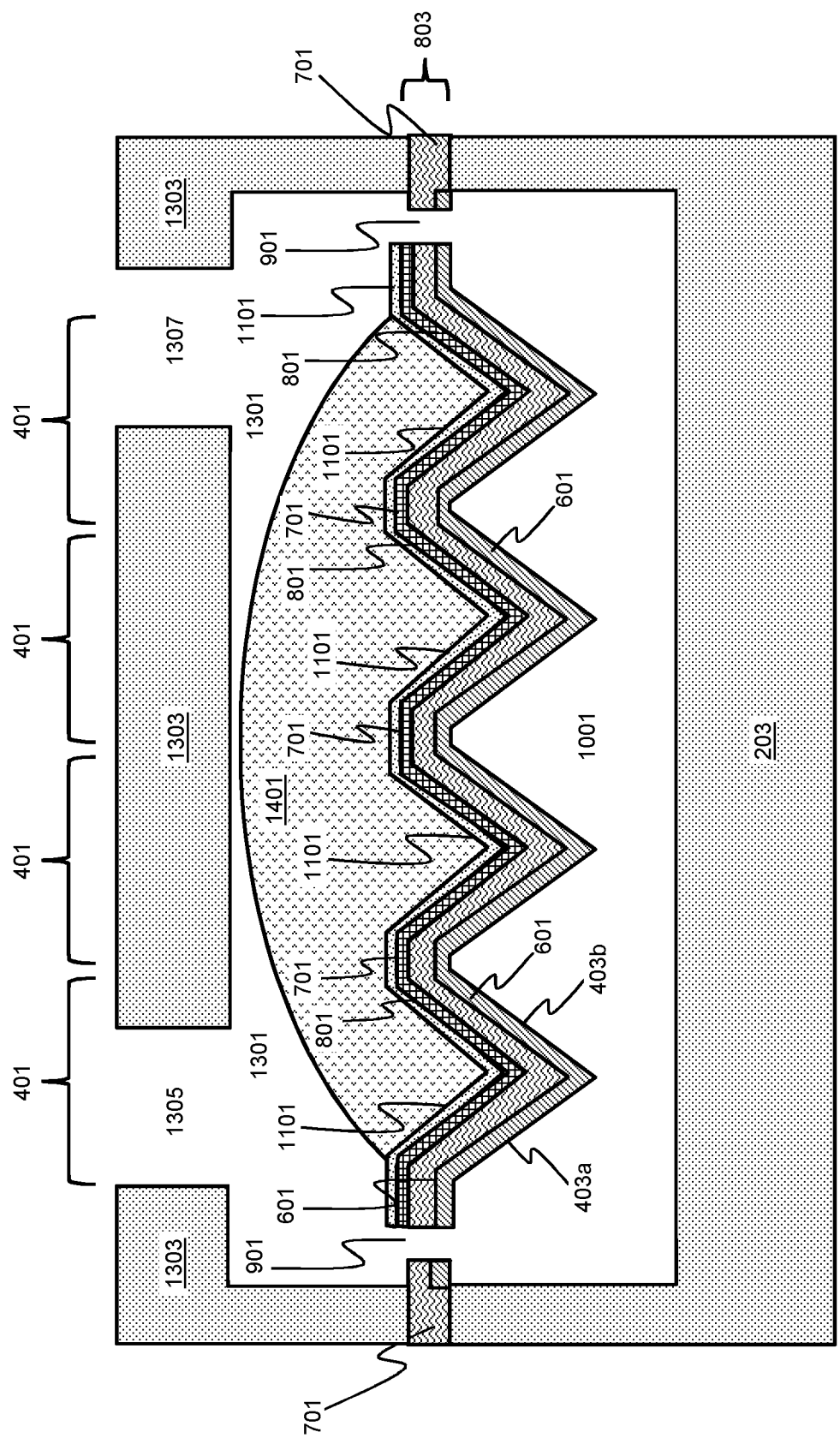

FIGS. 14A through 14D schematically illustrate cross-sectional views of FIG. 13 with: (1) an IDT top electrode and two different functional layers per V-shaped groove; (2) a sheet top electrode and two different functional layers per V-shaped groove; (3) an IDT top electrode and one functional layer over and along the V-shaped grooves; and (4) a sheet top electrode and one functional layer over and along the V-shaped grooves, respectively, in accordance with an exemplary embodiment. Referring to FIG. 14A, a liquid layer or drop 1401 (not drawn to scale) containing a particle or a chemical element may be formed over the set of V-shaped grooves 401. The particle or chemical element is then sensed based on shear-mode acoustic wave resonation (not shown for illustrative convenience). Specifically, resonance frequency of the device in rest is $f_0$. The particles bind and create mass loading Δm of the sensor. Mass loading Δm creates frequency shifting Δf proportional to the particular concentration. Particle detection occurs using the ratio $\Delta m/m_0 \sim \Delta f/f_0$. As discussed above, shear mode is less sensitive to viscous damping relative to SAW and BAW filters. Therefore a shear-mode sensor has a better Q factor and sensitivity relative to the SAW and BAW filters. For bio particle detection, the metal layer 801/801' (top electrode) of the shear-mode acoustic wave resonator 803 is functionalized with one or more functional layers 1101/1103, e.g., Au, etc., as described with respect to FIG. 11. Further, multiple chemicals/particles can be detected if customized functional layers 1101/1103 are used in each V-shape groove 401.

Figure 15A:
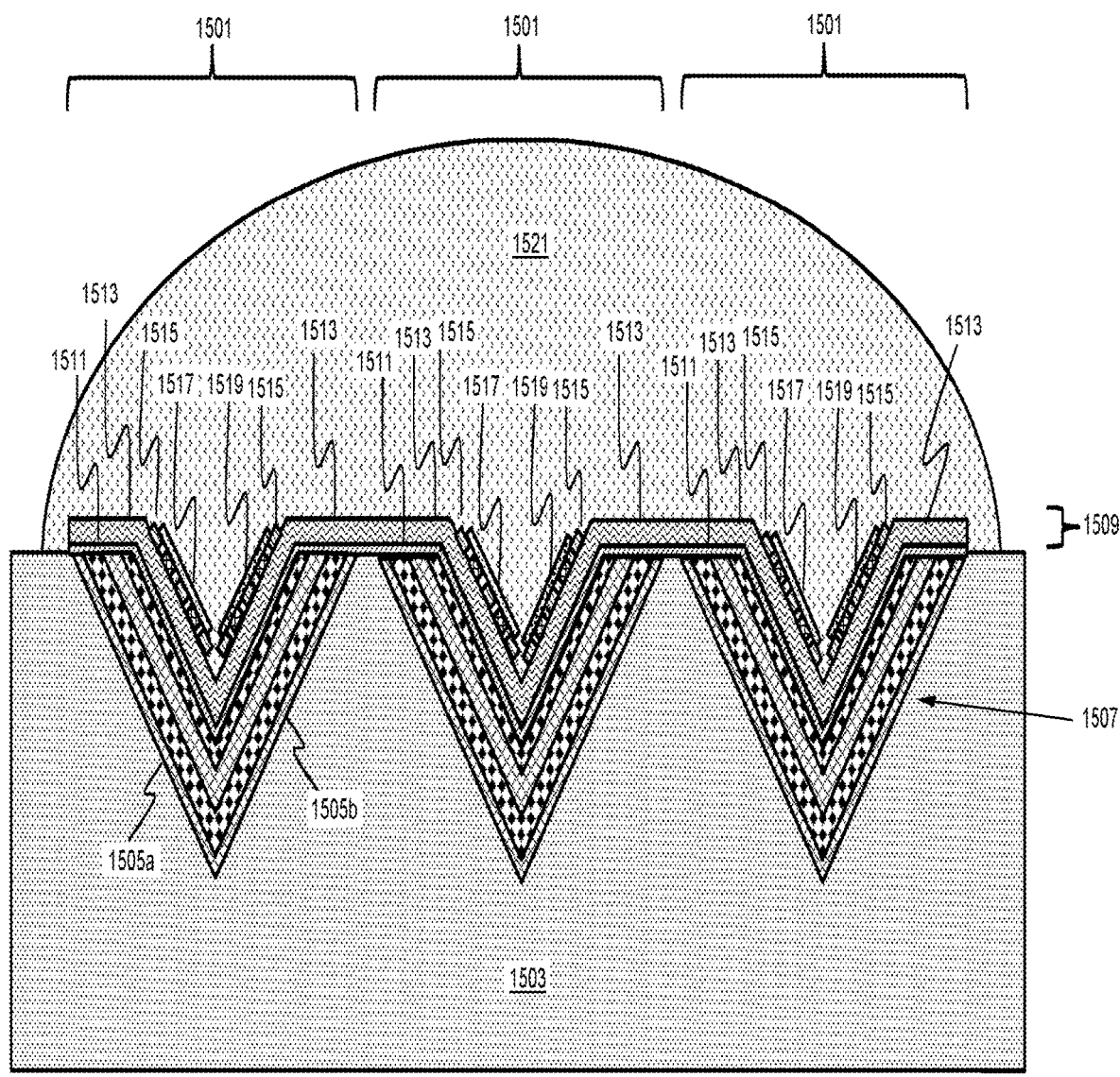
FIGS. 15A through 15D schematically illustrate cross-sectional views of FIGS. 14A through 14D, respectively, with a Bragg acoustic mirror formed on the V-shaped grooves of the [100] crystal orientation Si layer under the acoustic resonator and without a cavity, in accordance with an exemplary embodiment.
Figure 15B:
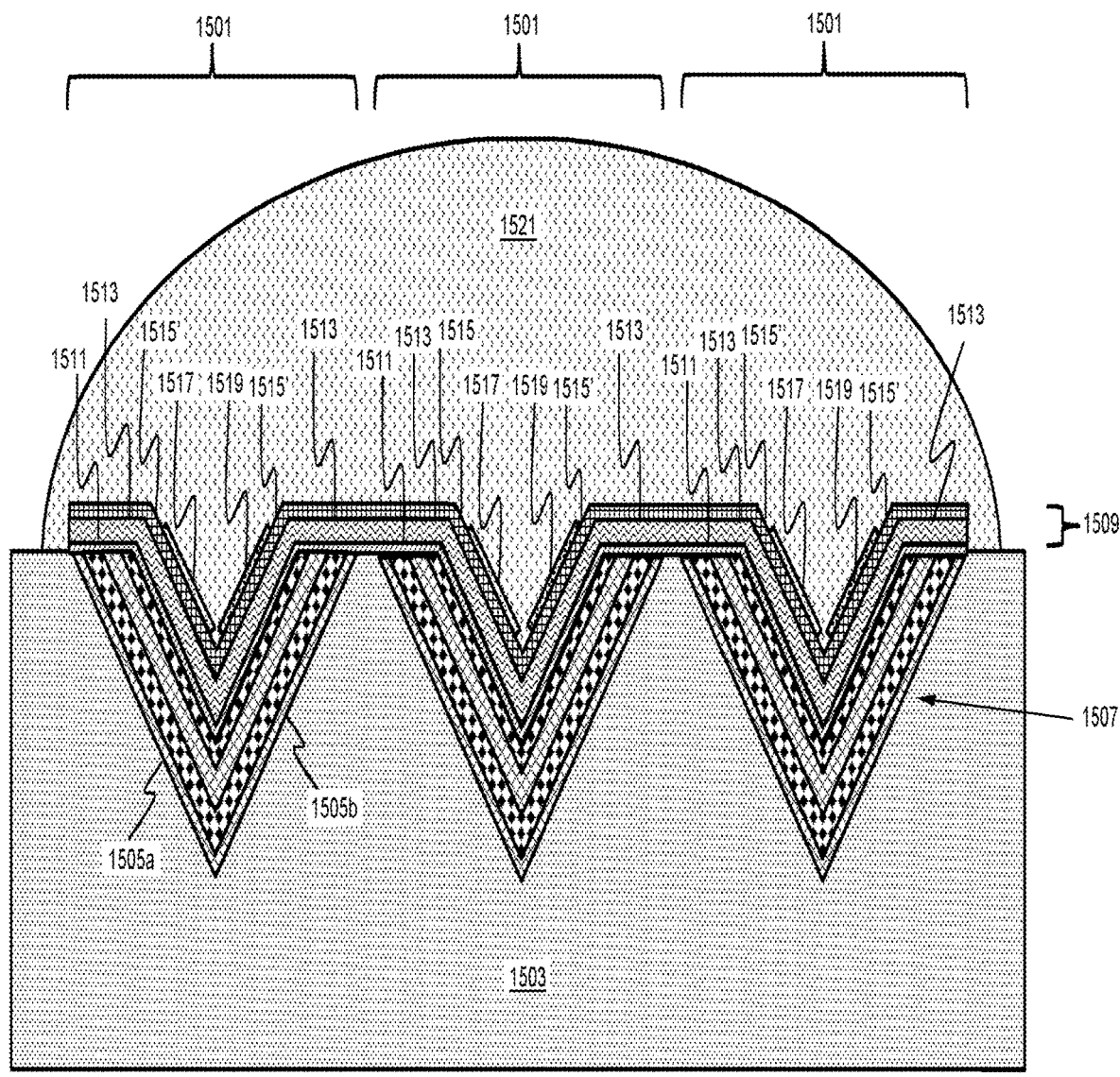

FIGS. 15A through 15D schematically illustrate cross-sectional views of FIGS. 14A through 14D, respectively, with a Bragg acoustic mirror formed on the V-shaped grooves of the [100] crystal orientation Si layer under the acoustic resonator and without a cavity, in accordance with an exemplary embodiment. Referring to FIG. 15A, similar to the process steps described with respect to FIGS. 2A and 2B through 6A and 6B, respectively, a set of V-shaped grooves 1501 are formed, e.g., with 54.7° [111] Si surfaces 1505a and 1505b in a portion of a [100] crystal orientation Si layer 1503 formed over a substrate (not shown for illustrative convenience) by a wet etch or a dry etch, as described more fully with respect to FIGS. 4A and 4B. In this instance, the depth of each V-shaped groove 1501 may be 10 μm by 10 μm in width. It should be understood that the number of V-shaped grooves 1501 in FIGS. 15A through 15D are meant to represent a section of a device; however, the specific number of V-shaped grooves 1501 is for illustration convenience only and not intended as a limitation, e.g., the set or device may include 10 V-shaped grooves 1501 or the set or device may include a 10×10 array of V-shaped grooves 1501, etc.

Subsequently, a Bragg reflector structure 1507 is formed, e.g., by depositing layers of alternating high/low acoustic impedance values and with as close as possible to an approximate thickness of nλ/4, wherein n is a positive odd integer, over the set of V-shaped grooves 1501 prior to the forming of the metal layer 601 (bottom electrode) of the shear-mode acoustic wave resonator 803, as described in FIG. 8. The Bragg reflector structure 1507 may then be planarized, e.g., by CMP, down to the [100] crystal orientation Si layer 1503. An acoustic filter or resonator stack 1509 is then formed of a metal layer 1511 (bottom electrode), e.g., formed of Mo or W; a thin-film piezoelectric layer 1513, e.g., formed of AlN, ScAlN, ZnO, LiNbO$_3$, LiTaO$_3$, PZT, PVDF, or a material having similar functional properties, e.g., AlN; and a metal layer 1515 (top electrode), e.g., formed of Mo or W, in an IDT pattern 1515 (FIGS. 15A and 15C) or in a sheet 1515' along or over and along the opposing slopes of the thin-film piezoelectric layer 1513 (FIGS. 15B and 15D), respectively, as described with respect to FIGS. 6A/6B, 7, and 8.

Functional layers 1517 and 1519 are then formed in the same manner as the functional layers 1101 and 1103, as described more fully above with respect to FIG. 11. Thereafter, a liquid layer or drop 1521 (not drawn to scale) containing a particle or a chemical element may be formed over the set of V-shaped grooves 1501. Each particle or chemical element may then be sensed based on shear-mode acoustic wave resonation (not shown for illustrative convenience) as more fully described above with respect to FIGS. 14A through 14D.

Figure 15C:
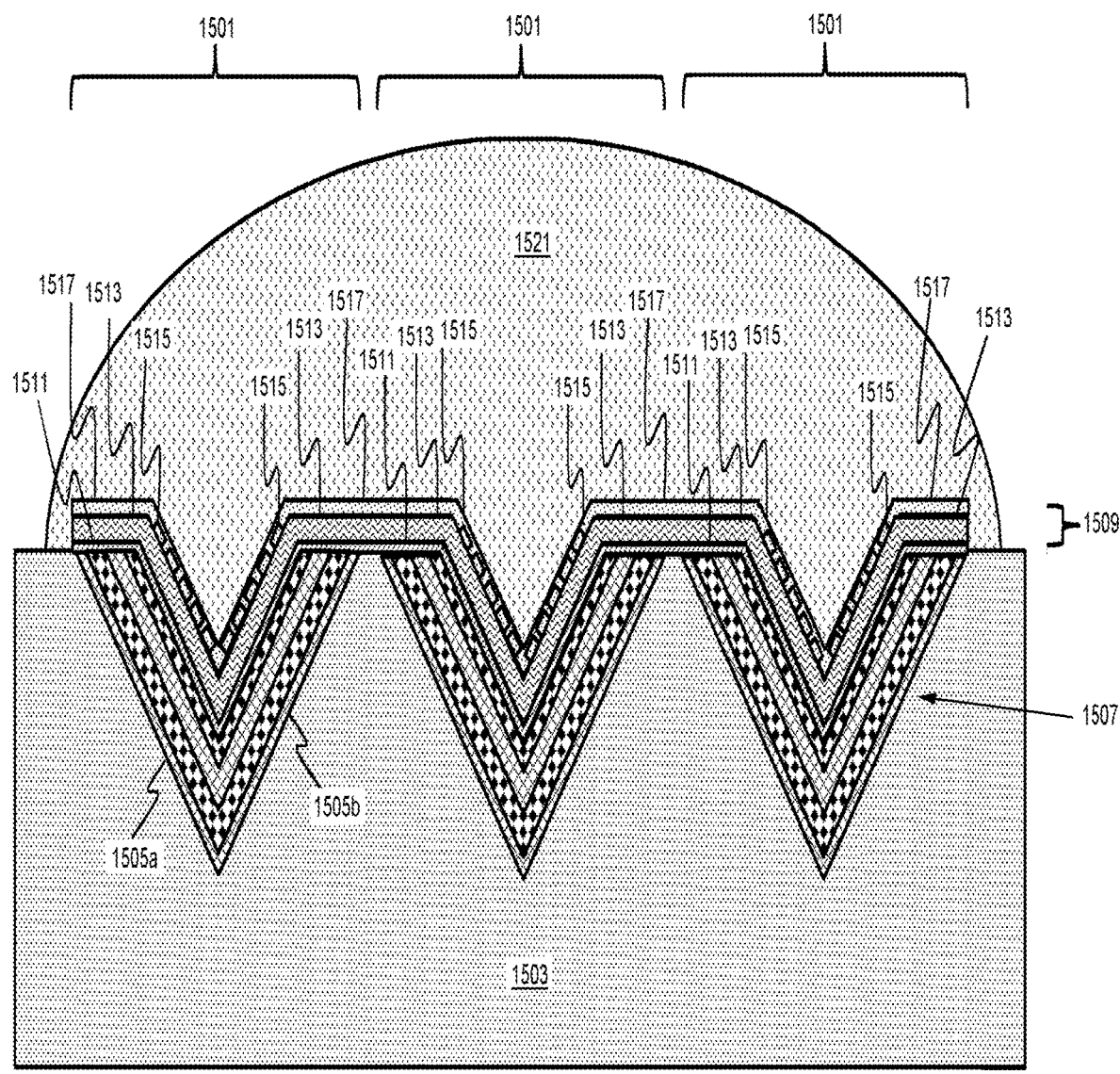
Figure 15D:
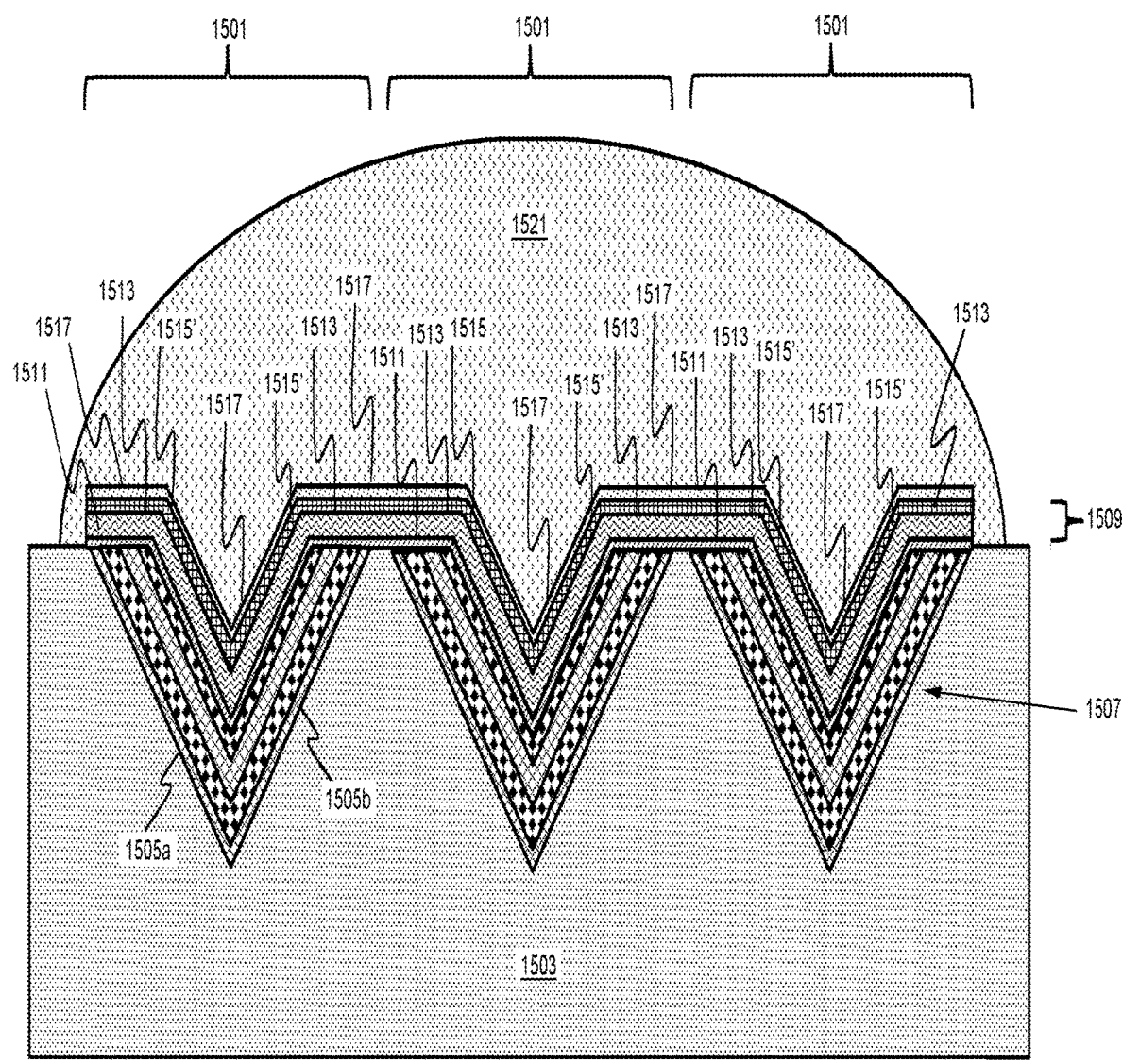
Figure 16A:
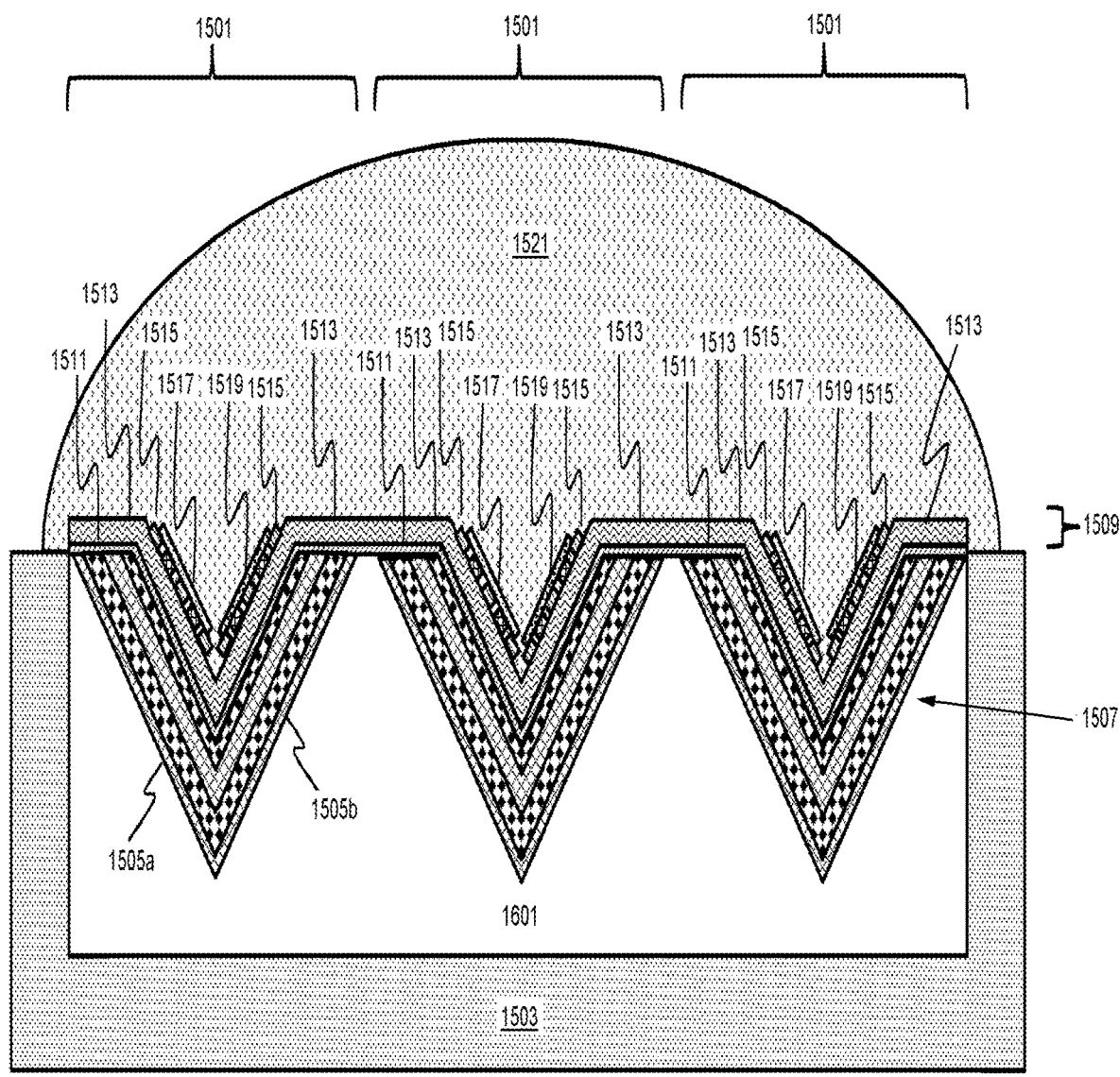
FIGS. 16A through 16D schematically illustrate cross-sectional views of FIGS. 15A through 15D, respectively, with a cavity under the Bragg acoustic mirror, in accordance with an exemplary embodiment.
Figure 16B:
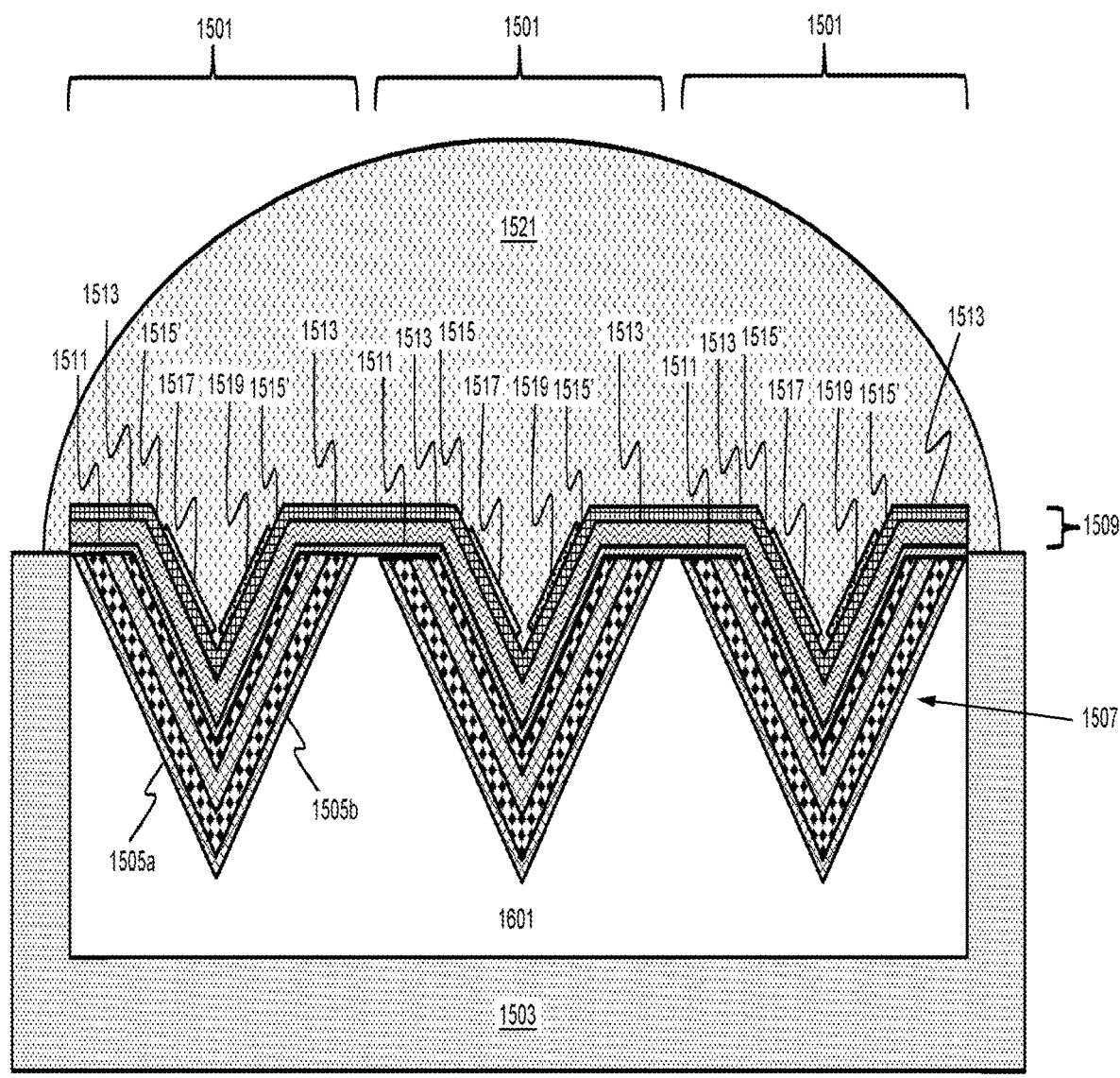
Figure 16C:
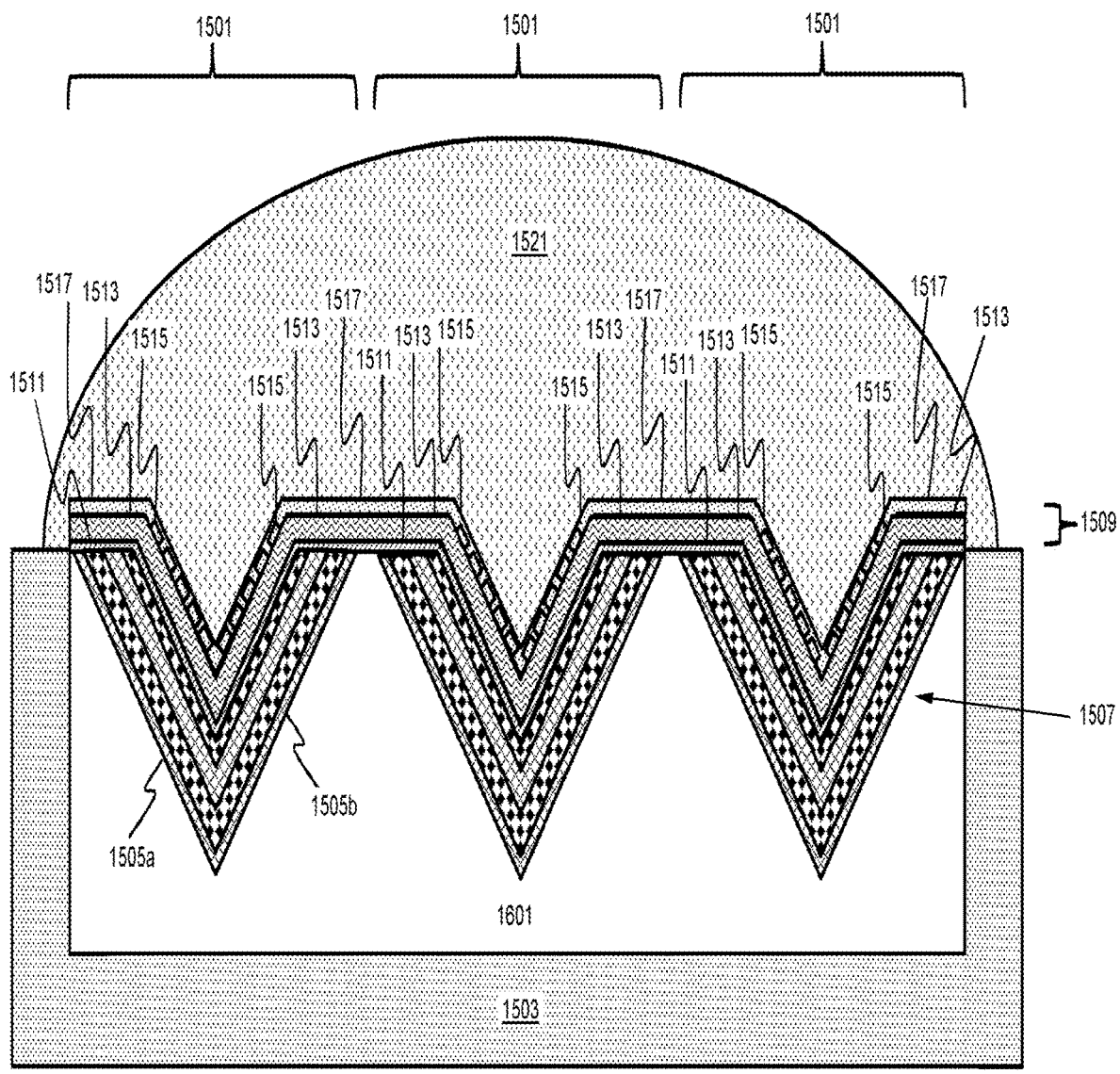
Figure 16D:
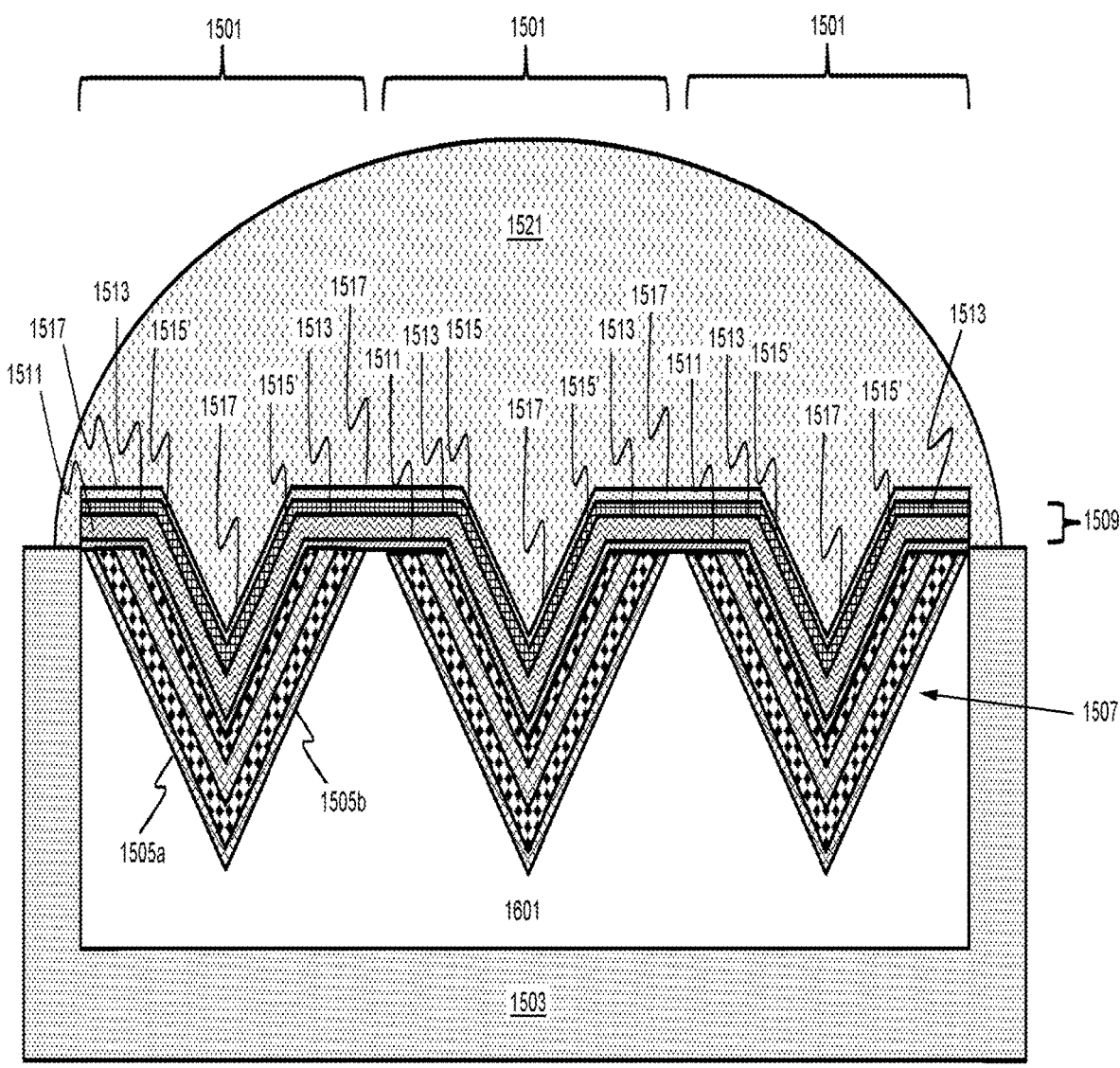
Figure 17A:
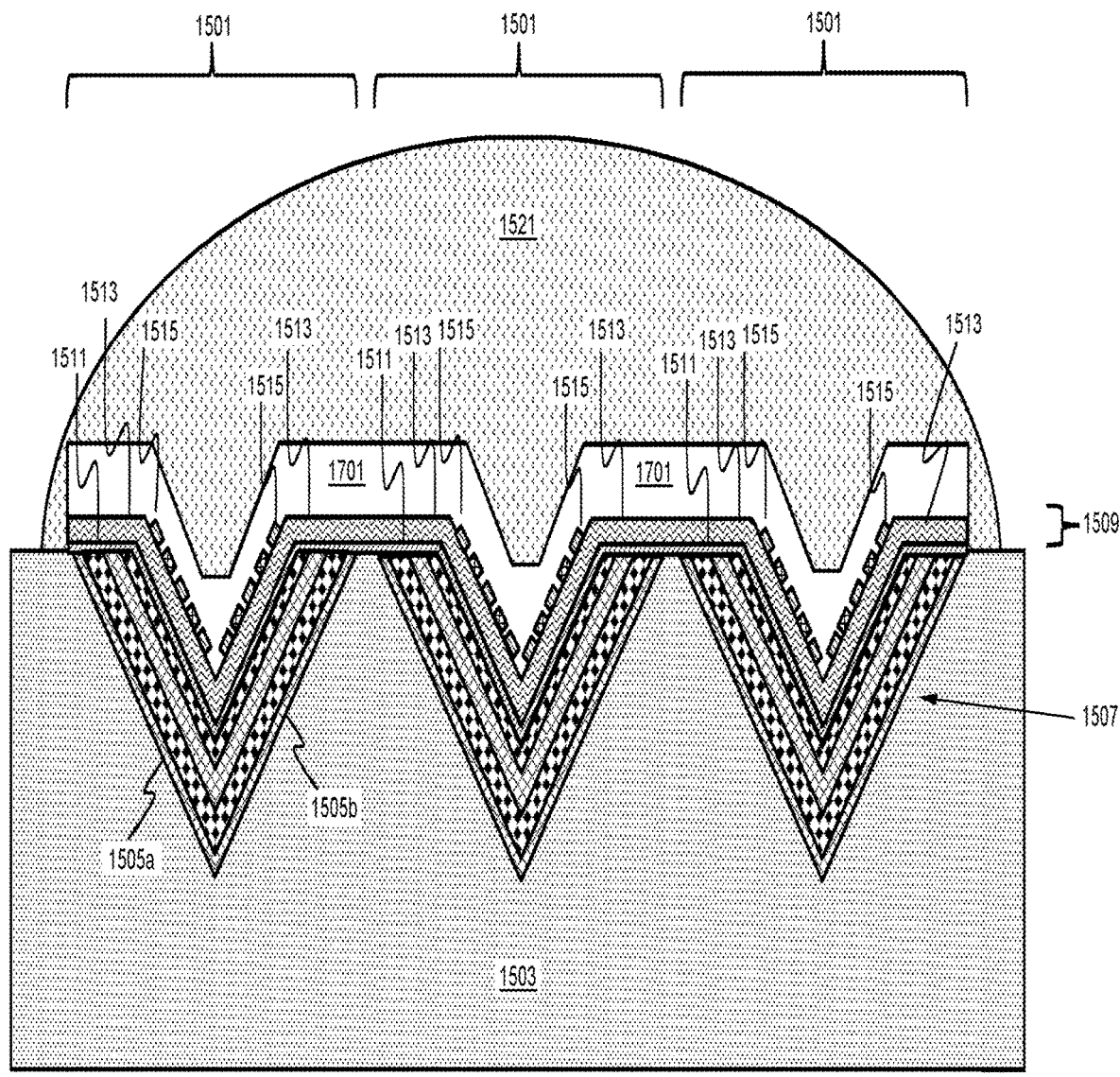
FIGS. 17A and 17B and 18A and 18B schematically illustrate cross-sectional views of FIGS. 15A and 15B and 16A and 16B, respectively, with an acoustic waveguide layer over the acoustic resonator and without any functional layers, in accordance with an exemplary embodiment.
Figure 17B:
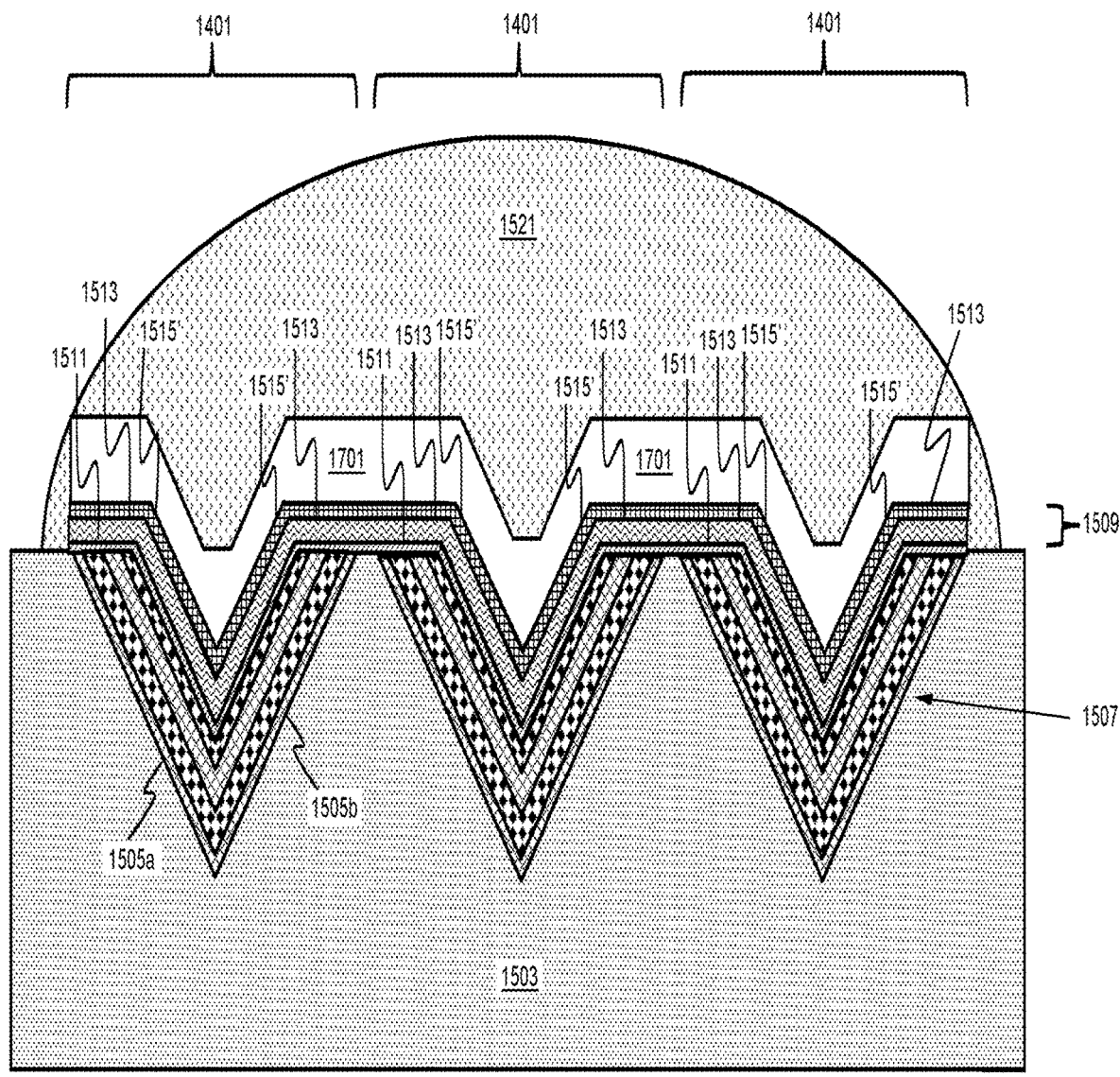
Figure 18A:
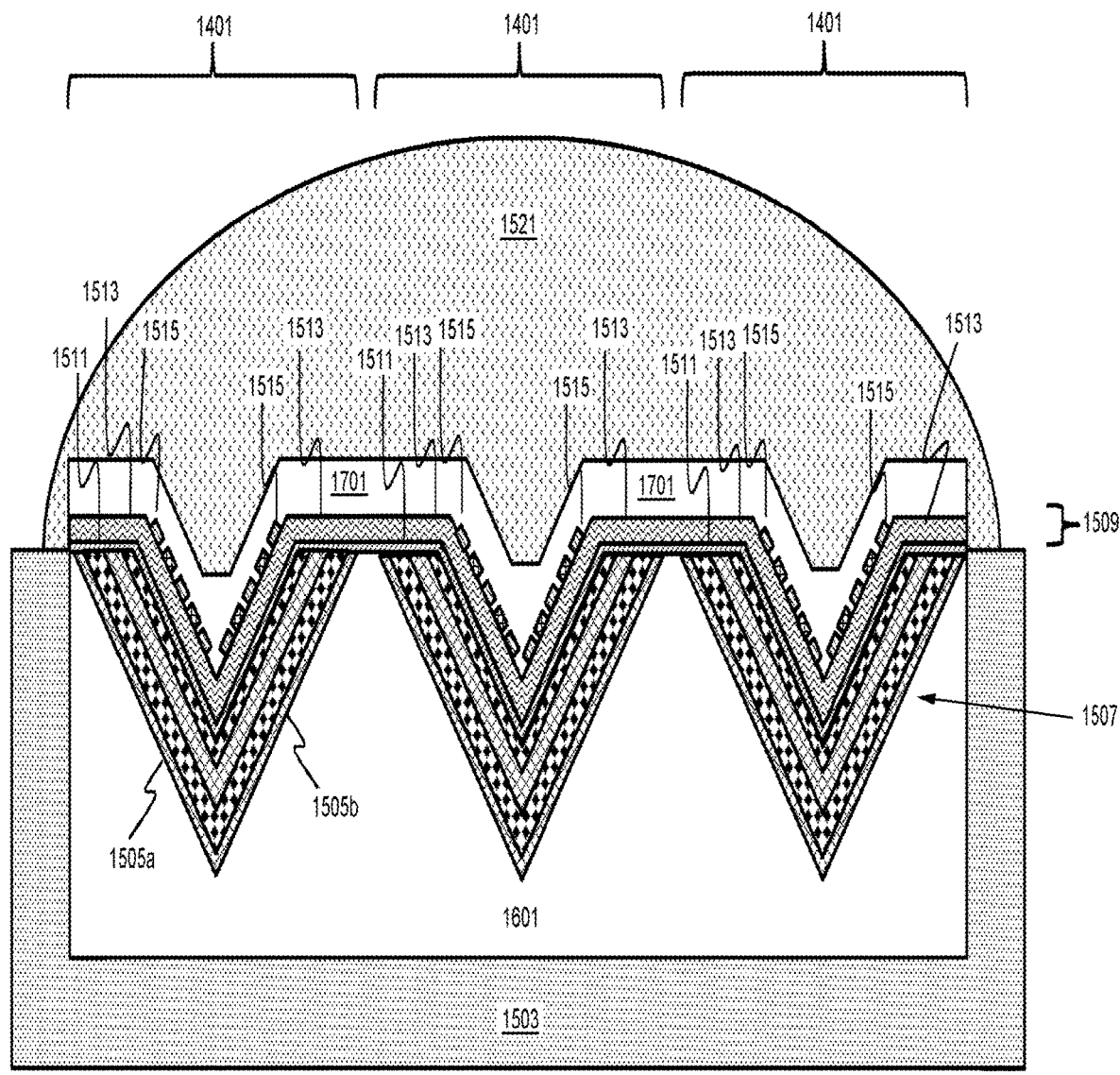
Figure 18B:
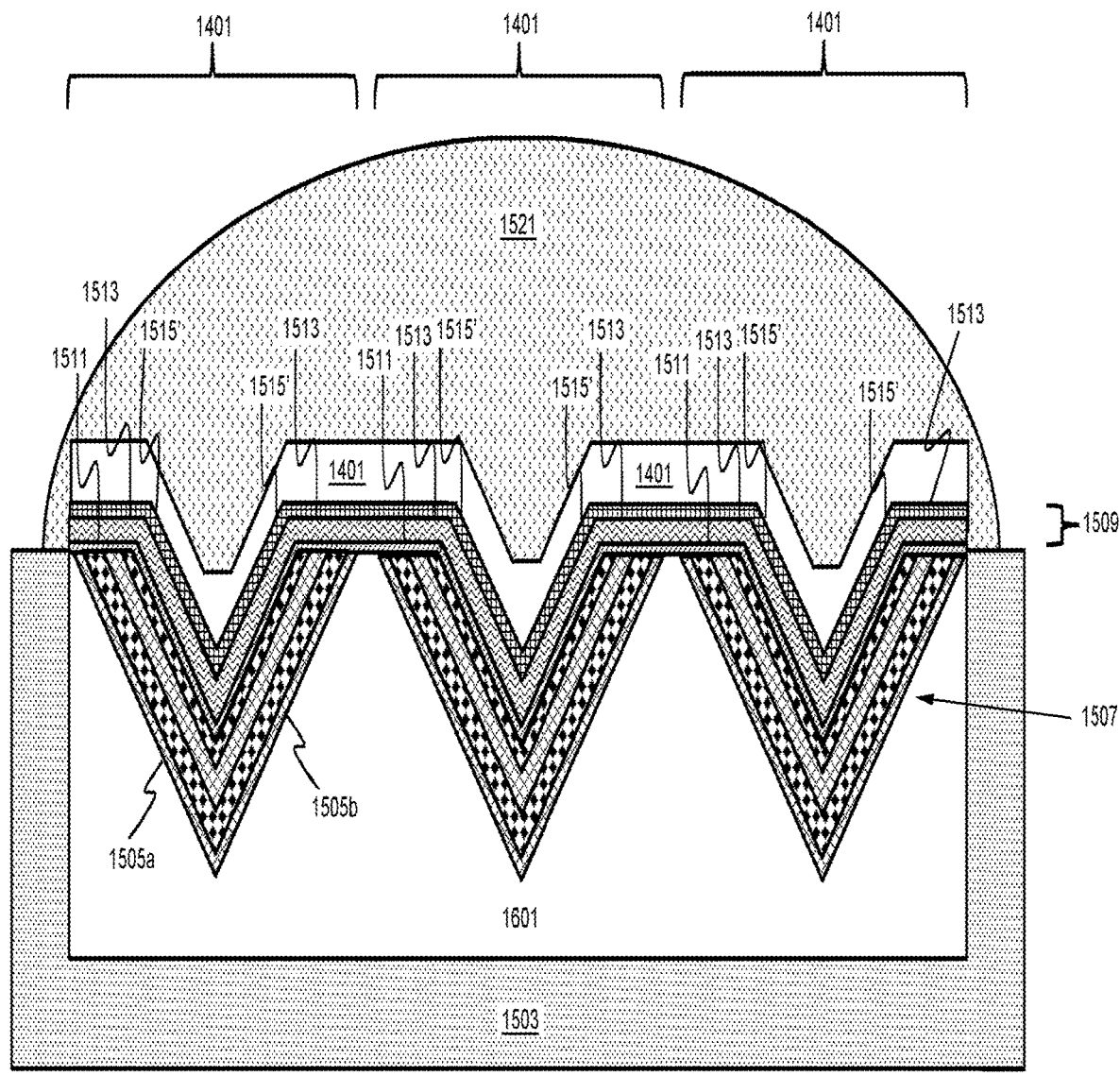
Figure 19A:
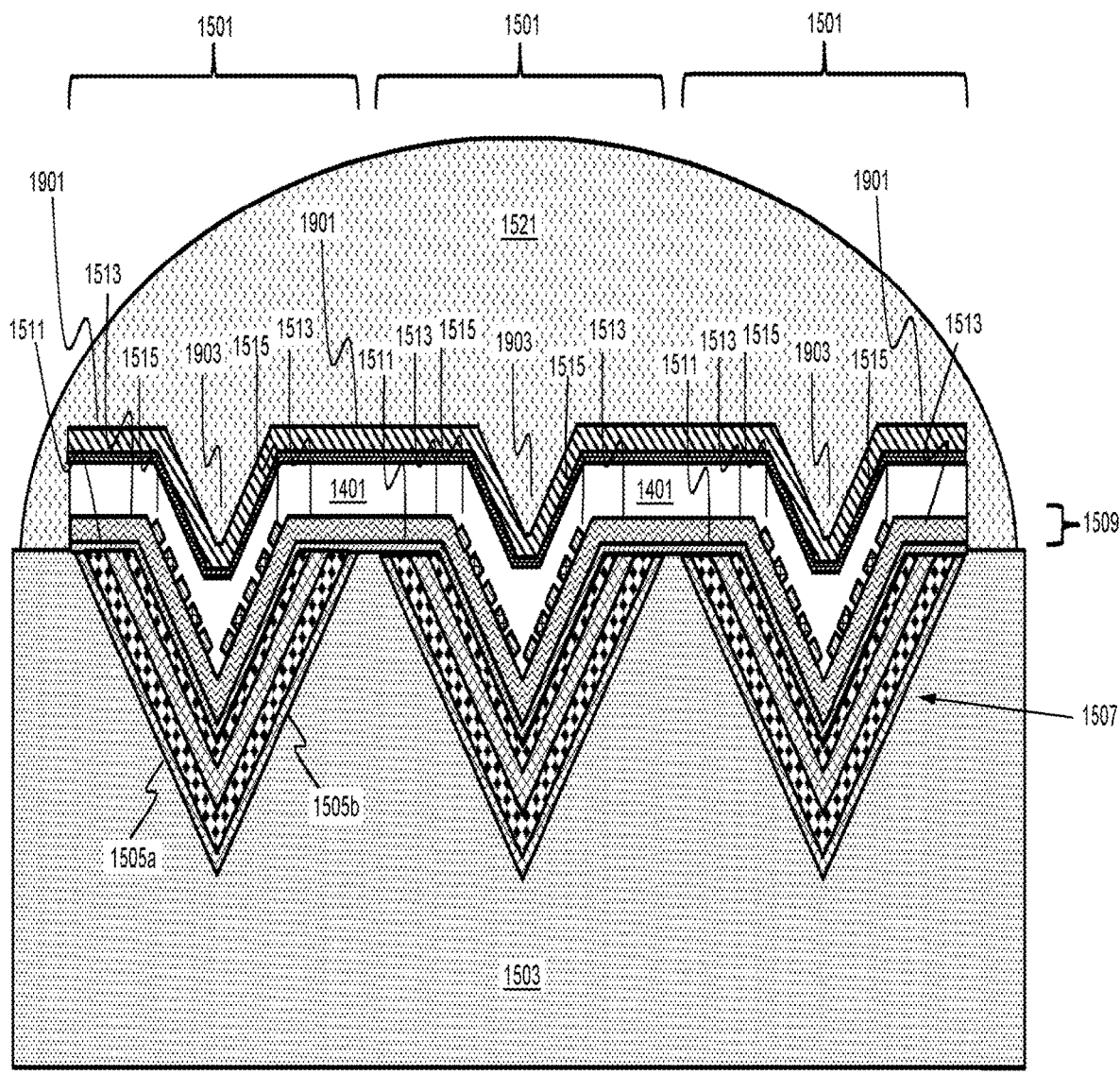
FIGS. 19A and 19B and 20A and 20B schematically illustrate cross-sectional views of FIGS. 17A and 17B and 18A and 18B, respectively, with an intermediate adhesive layer and an upper acoustic liquid trap layer formed over the acoustic waveguide layer, in accordance with an exemplary embodiment.
Figure 19B:
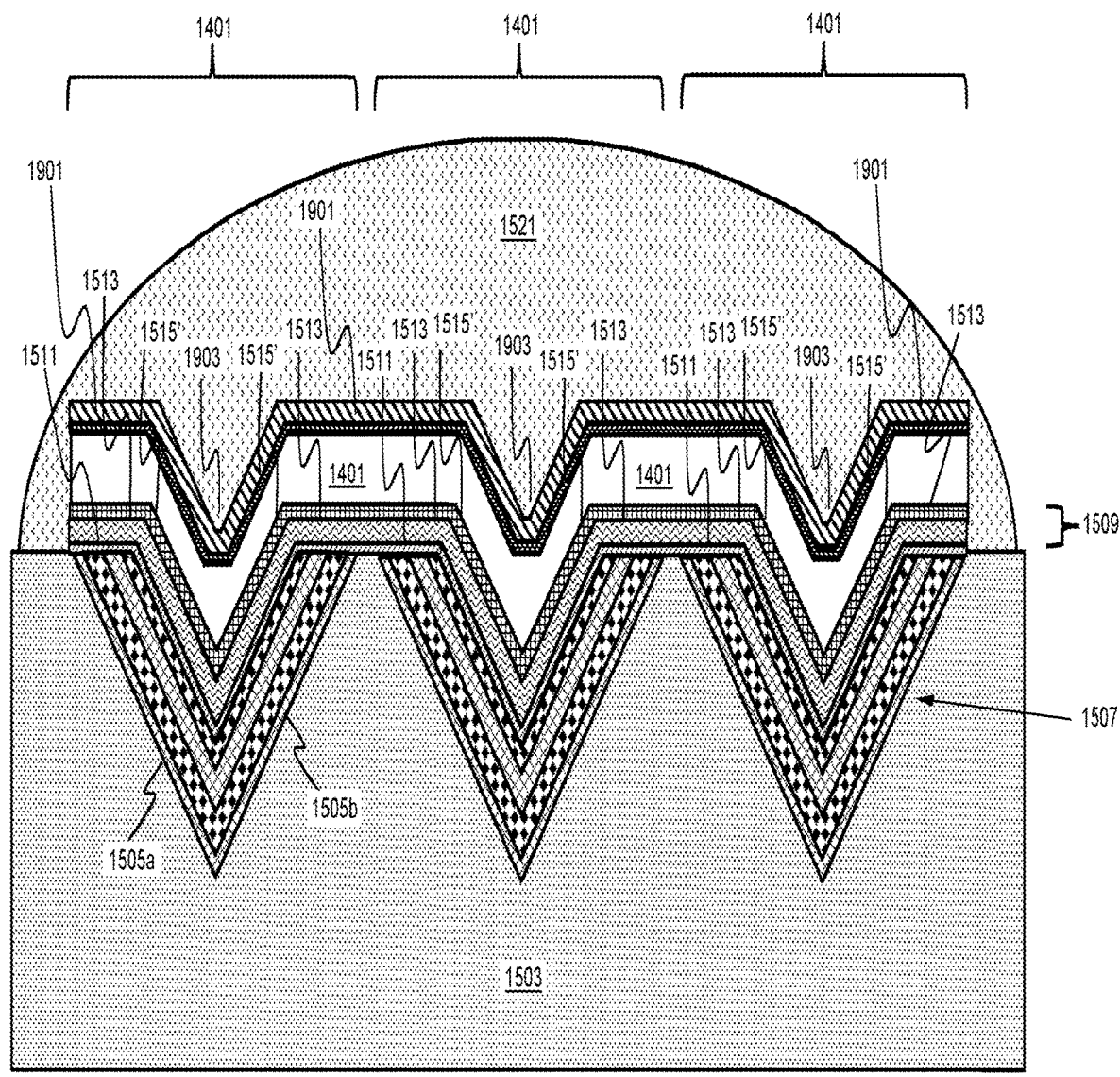
Figure 20A:
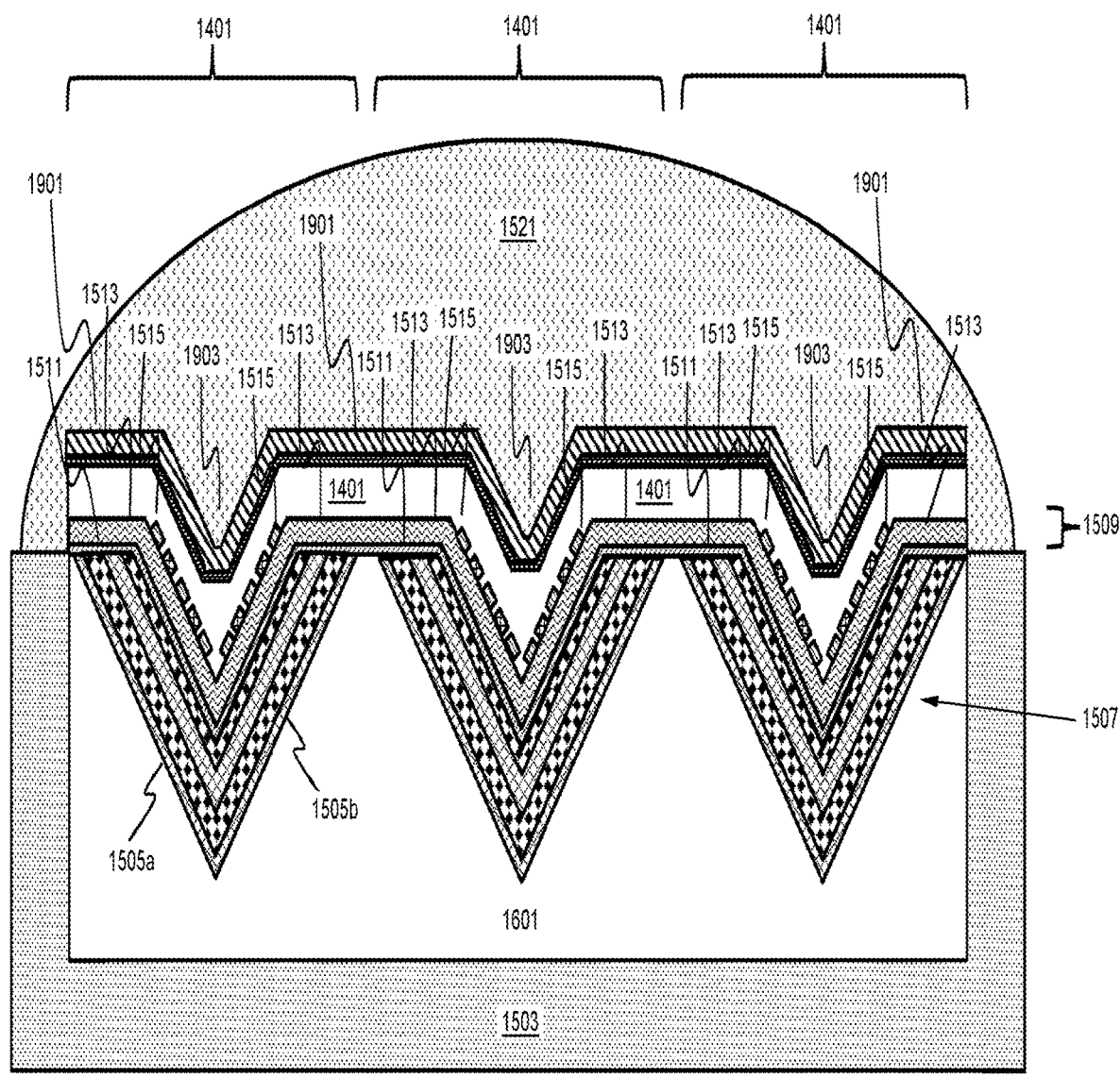
Figure 20B:
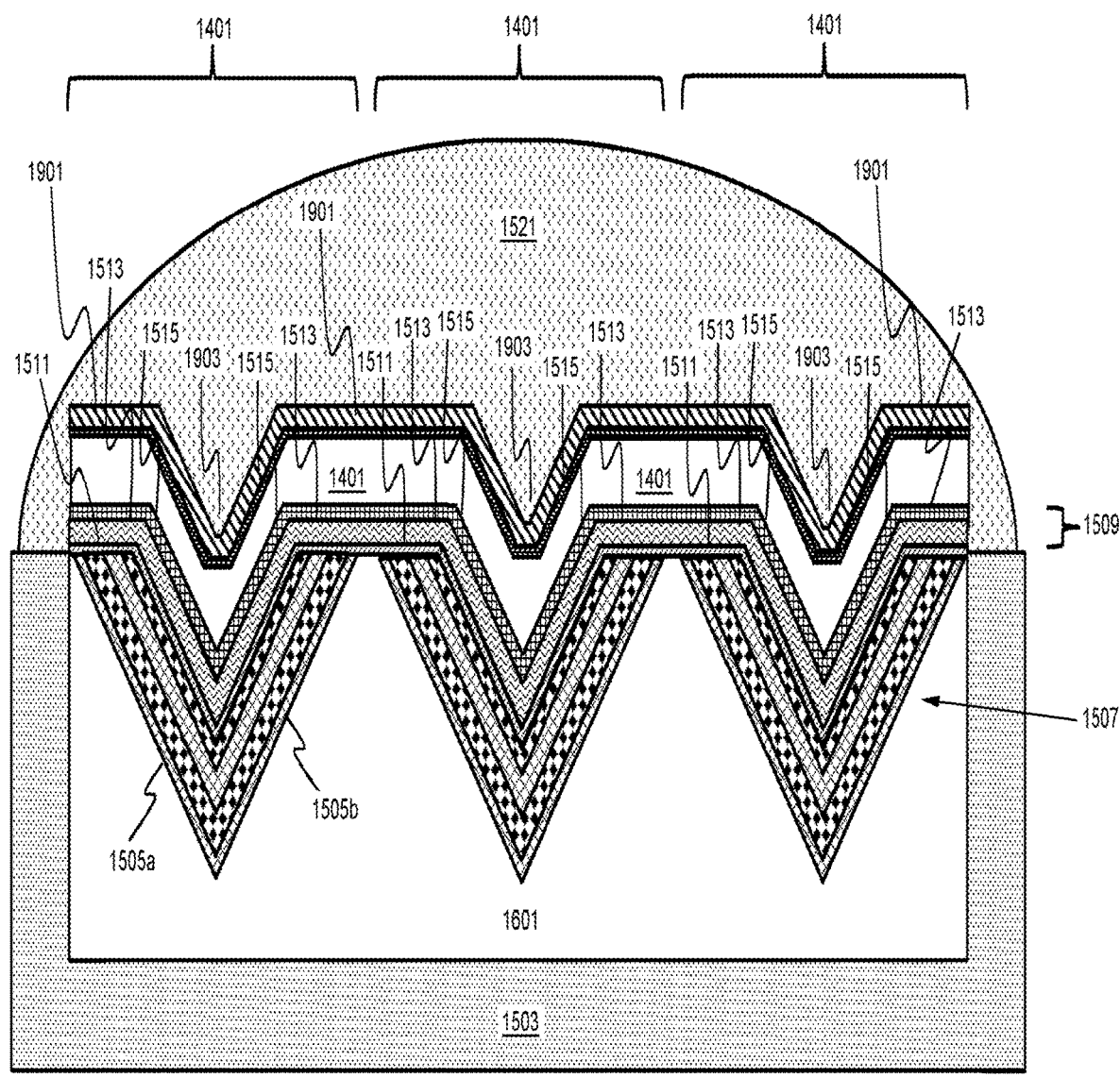

Similar to FIGS. 14B through 14D, FIG. 15B depicts a sheet top electrode 1515' over the thin-film piezoelectric layer 1513 and two functional layers 1517 and 1519 per V-shaped groove 1501; FIG. 15C depicts an IDT pattern top electrode 1514 along the thin-film piezoelectric layer 1513 and one functional layer 1517 over and along the V-shaped grooves 1501; and FIG. 15D illustrates a sheet top electrode 1515' over the thin-film piezoelectric layer 1513 and one functional layer 1517 over and along the V-shaped grooves 1501.

FIGS. 16A through 16D schematically illustrate cross-sectional views of FIGS. 15A through 15D, respectively, with a cavity under the Bragg acoustic mirror, in accordance with an exemplary embodiment. FIGS. 16A through 16D are almost identical to FIGS. 15A through 15D; however, in each instance, a cavity 1601 is formed in a portion of the [100] crystal orientation Si layer 1503 under the Bragg reflector structure 1507.

FIGS. 17A and 17B and 18A and 18B schematically illustrate cross-sectional views of FIGS. 15A and 15B and 16A and 16B, respectively, with an acoustic waveguide layer over the acoustic resonator and without any functional layers, in accordance with an exemplary embodiment. FIGS. 17A and 17B and 18A and 18B are nearly identical to FIGS. 15A and 15B and 16A and 16B, respectively; however, in each instance, an acoustic waveguide layer 1701 is formed over the metal layer 1515 and the metal layer 1515', respectively, prior to the formation of the liquid drop 1521 and without the forming of the functional layers 1517 and 1519.

FIGS. 19A and 19B and 20A and 20B schematically illustrate cross-sectional views of FIGS. 17A and 17B and 18A and 18B, respectively, with an intermediate adhesive layer and an upper acoustic liquid trap layer formed over the acoustic waveguide layer, in accordance with an exemplary embodiment. FIGS. 19A and 19B and 20A and 20B are nearly identical to FIGS. 17A and 17B and 18A and 18B, respectively; except in each instance, an intermediate adhesive layer 1901 and an upper acoustic liquid trap layer 1903 are formed over the acoustic waveguide layer 1701 prior to the formation of the liquid layer or drop 1521.

The embodiments of the present disclosure can achieve several technical effects including a shear-mode acoustic resonator and functional layers formed on V-shaped grooves of a [100] crystal orientation Si layer over a substrate; a thickness shear-mode sensor in viscous media with a better loaded Q factor and sensitivity relative to known designs; an efficient liquid trap topography provided by the V-shaped grooves; a mass sensor that can detect concentration/density of fluid circulating through the V-shaped grooves; a chemical sensor that can detect particles bound to the sensor's surface at the V-shaped grooves; a multi-channel biological sensor array using multiple functional layers; and a biological sensor array with customizable sensitivity of each sensor in the array. Embodiments of the present disclosure enjoy utility in various industrial applications as, for example, microprocessors, smart phones, mobile phones, cellular handsets, set-top boxes, DVD recorders and players, automotive navigation, printers and peripherals, networking and telecom equipment, gaming systems, and digital cameras. The present disclosure therefore has industrial applicability in any devices including a chemical/physical sensor for liquid environment sensing.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
forming a set of V-shaped grooves in a [100] crystal orientation silicon (Si) layer over a substrate;
forming an acoustic resonator over and along the V-shaped grooves, the acoustic resonator comprising a first metal layer, a thin-film piezoelectric layer, and a second metal layer in an interdigitated (IDT) pattern or a sheet; and
forming a functional layer along at least one slope of the acoustic resonator.

2. The method according to claim 1, further comprising (1) forming the functional layer along opposing slopes of the acoustic resonator; (2) forming the functional layer along an opposing slope of the acoustic resonator and a second functional layer along an opposite opposing slope of the acoustic resonator; (3) forming a plurality of functional layers along opposing slopes of the acoustic resonator; or (4) forming one or more functional layers along opposing slopes of one or more portions of the acoustic resonator.

3. The method according to claim 1, further comprising forming a cavity in the [100] crystal orientation Si layer under the acoustic resonator subsequent to the forming the acoustic resonator.

4. The method according to claim 1, further comprising:
forming a Bragg reflector along the V-shaped grooves prior to forming the acoustic resonator; and
forming the acoustic resonator over and along opposing slopes of the Bragg reflector.

5. The method according to claim 4, further comprising forming an acoustic waveguide layer over and along opposing slopes of the acoustic resonator or sequentially forming an acoustic waveguide layer, an intermediate adhesive layer, and an extra acoustic liquid trap layer over and along opposing slopes of the acoustic resonator.

6. The method according to claim 1, further comprising:
forming a Bragg reflector along the V-shaped grooves prior to forming the acoustic resonator;
forming the acoustic resonator over and along opposing slopes of the Bragg reflector; and
forming a cavity in the [100] crystal orientation Si layer under the Bragg reflector subsequent to the forming of the acoustic resonator.

7. The method according to claim 6, further comprising forming an acoustic waveguide layer over and along opposing slopes of the acoustic resonator or sequentially forming an acoustic waveguide layer, an intermediate adhesive layer, and an extra acoustic liquid trap layer over and along opposing slopes of the acoustic resonator.

8. The method according to claim 1, further comprising:
forming a cap cavity over the set subsequent to the forming of the at least one functional layer;
forming a capping layer over the cap cavity; and
forming an inlet and an outlet, laterally separated, through the capping layer down to the cap cavity.

9. The method according to claim 1, further comprising:
forming a liquid layer containing a particle or a chemical element over the set,
wherein the particle or the chemical element is sensed by the acoustic resonator based on a shear-mode acoustic wave resonation.

10. A device comprising:
a set of V-shaped grooves in a [100] crystal orientation silicon (Si) layer over a substrate;
an acoustic resonator over and along the V-shaped grooves, the acoustic resonator comprising a first metal layer, a thin-film piezoelectric layer, and a second metal layer of the acoustic resonator in an interdigitated (IDT) pattern or a sheet, wherein portions of the second metal layer are disposed in the V-shaped grooves; and
a functional layer for binding to chemicals or particles in a liquid environment, wherein the functional layer is disposed along at least one slope of the acoustic resonator.

11. The device according to claim 10, wherein device comprises a shear-mode acoustic sensor, a mass sensor, a chemical sensor, a multi-channel biological sensor, or a biological sensor array.

12. The device according to claim 10, further comprising (1) the functional layer along opposing slopes of the acoustic resonator; (2) the functional layer along an opposing slope of the acoustic resonator and a second functional layer along an opposite opposing slope of the acoustic resonator; (3) a plurality of functional layers along opposing slopes of the acoustic resonator; or (4) one or more functional layers along opposing slopes of one or more portions of the acoustic resonator.

13. The device according to claim 10, further comprising a cavity in the [100] crystal orientation Si layer under the acoustic resonator.

14. The device according to claim 10, further comprising:
a Bragg reflector along the V-shaped grooves; and
the acoustic resonator over and along opposing slopes of the Bragg reflector.

15. The device according to claim 14, further comprising an acoustic waveguide layer over and along opposing slopes of the acoustic resonator or an acoustic waveguide layer, an intermediate adhesive layer, and an extra acoustic liquid trap layer sequentially formed over and along opposing slopes of the acoustic resonator.

16. The device according to claim 10, further comprising:
a Bragg reflector along the V-shaped grooves;
the acoustic resonator over and along opposing slopes of the Bragg reflector; and
a cavity in the [100] crystal orientation Si layer under the Bragg reflector.

17. The device according to claim 16, further comprising an acoustic waveguide layer over and along opposing slopes of the acoustic resonator or an acoustic waveguide layer, an intermediate adhesive layer, and an extra acoustic liquid trap layer sequentially formed over and along opposing slopes of the acoustic resonator.

18. A method comprising:
forming a set of V-shaped grooves in a [100] crystal orientation silicon (Si) layer over a substrate;
forming a Bragg reflector along the V-shaped grooves;
forming an acoustic resonator over and along opposing slopes of the Bragg reflector, the acoustic resonator comprising a first metal layer, a thin-film piezoelectric layer, and
a second metal layer in an interdigitated (IDT) pattern or a sheet;
forming a cavity in the [100] crystal orientation Si layer under the Bragg reflector; and
forming at least one functional layer along a slope of the acoustic resonator.

19. The method according to claim 18, further comprising:
forming the set of V-shaped grooves by a wet etch or a dry etch: and
(1) forming the functional layer along opposing slopes of the acoustic resonator; (2) forming the functional layer along an opposing slope of the acoustic resonator and a second functional layer along an opposite opposing slope of the acoustic resonator; (3) forming a plurality of functional layers along opposing slopes of the acoustic resonator; or (4) forming one or more functional layers along opposing slopes of one or more portions of the acoustic resonator.

20. The method according to claim 18, further comprising forming an acoustic waveguide layer over and along opposing slopes of the acoustic resonator or sequentially forming an acoustic waveguide layer, an intermediate adhesive layer, and an extra acoustic liquid trap layer over and along opposing slopes of the acoustic resonator.

* * * * *